(12) United States Patent
Yamamura et al.

(10) Patent No.: US 6,512,702 B1
(45) Date of Patent: Jan. 28, 2003

(54) NON-VOLATILE SEMICONDUCTOR MEMORY DEVICE AND DATA ERASE CONTROLLING METHOD FOR USE THEREIN

(75) Inventors: Toshio Yamamura, Yokohama (JP); Yoshihisa Sugiura, Kamakura (JP); Kazuhisa Kanazawa, Fujisawa (JP); Koji Sakui, Tokyo-To (JP); Hiroshi Nakamura, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/539,212

(22) Filed: Mar. 30, 2000

(30) Foreign Application Priority Data

Apr. 2, 1999 (JP) .............................................. 11-097003
Jun. 28, 1999 (JP) .............................................. 11-182248

(51) Int. Cl.$^7$ .............................................. G11C 16/04
(52) U.S. Cl. .............................. 365/185.33; 365/185.18
(58) Field of Search ........................ 365/185.33, 185.11, 365/185.29, 185.01

(56) References Cited

U.S. PATENT DOCUMENTS 5,371,702 A    12/1994  Nakai et al.
5,546,351 A  *  8/1996  Tanaka et al. ......... 365/230.06
5,841,721 A  * 11/1998  Kwon et al. ................. 365/218
6,031,764 A  *  2/2000  Imamiya et al. ....... 365/185.29

FOREIGN PATENT DOCUMENTS

DE    42 07 934 A    10/1992
EP    0 405 140 A1    1/1991
EP    0 662 692 A     7/1995

* cited by examiner

*Primary Examiner*—Hoai Ho
(74) *Attorney, Agent, or Firm*—Banner & Witcoff, Ltd.

(57) ABSTRACT

A memory cell array is divided into left and right cell arrays, each of which includes a plurality of blocks. Data erase is sequentially controlled by an erase control circuit on the basis of an erase command flag incorporated into a command register and an address incorporated into an address register. Batch erase is carried out with respect to selected blocks of the right and left cell arrays. After data erase, a verify operation is carried out with respect to the erased blocks by retrieving the erased blocks simultaneously with respect to the right and left cell arrays in parallel. Thus, the time required to retrieve the selected blocks for the verify operation after data erase is shortened, so that the time required to carry out the whole data erase is shortened.

17 Claims, 20 Drawing Sheets

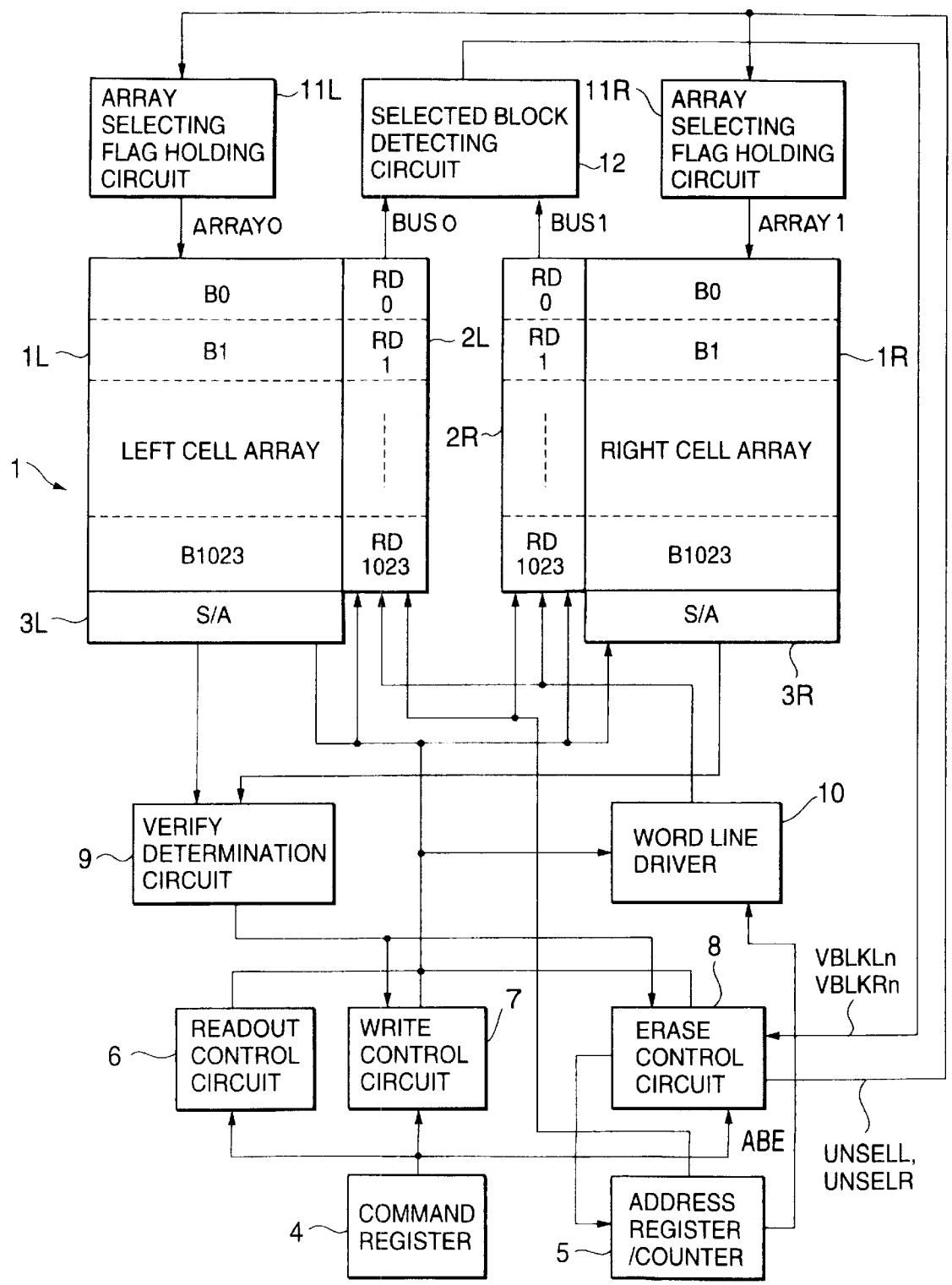
F I G. 8A

NON-VOLATILE SEMICONDUCTOR MEMORY DEVICE AND DATA ERASE CONTROLLING METHOD FOR USE THEREIN

RELATED APPLICATION

This application claims benefit of priority under 35 U.S.C. §119 to Japanese Patent Applications No. H11-97003, filed on Apr. 2, 1999, and H11-182248, filed on Jun. 28, 1999, the entire contents of which are incorporated by reference herein.

BACKGROUND OF THE INVENTION

1. Field of the Invention

The present invention relates generally to a non-volatile semiconductor memory device (EEPROM) capable of electrically rewriting data and batch-erasing data in every block. More specifically, the invention relates to the improvement of a data erase sequence.

2. Description of the Related Background Art

A typical NAND type EEPROM has the function of selecting and batch-erasing one or more blocks of a memory cell array (see, e.g., Japanese Patent No. 2667617). Such a batch-erasable EEPROM has the function of carrying out an erase verify readout for determining whether a memory cell of an erased block is sufficiently erased, and erasing the selected block(s) again if the erase is insufficient. This function is automatically carried out by means of a sequencer provided in a chip.

Specifically, when data of an EEPROM of this type is erased, a user system inputs the address of a selected block, which includes a plurality of objects to be erased, and an erase executing command to an EEPROM chip. Thus, on the chip side, data erase is started, and thereafter, busy signals are outputted until a series of data erasing operations including a verify operation are completed. During this, the user system side is not accessible to the chip and is in a waiting state until the erasing operations are completed.

Specifically, the data erasing operations are carried out by, e.g., applying a boosted erase voltage to a p-type well, in which a memory array is formed, applying 0V to all of the word lines of the selected block, and allowing the word lines of the unselected blocks to be floating. At this time, in the memory cells of selected blocks, electrons of floating gates are emitted to the substrate side, so that data are batch-erased. In the unselected blocks, the potentials of the word lines are raised by capacitive coupling, so that data are not erased.

After a predetermined erase time elapses by an internal timer, the erasing operations are completed, and the erase voltage of the cell array is discharged. Thereafter, in order to carry out the verify operation, the operation for retrieving the selected block is carried out. That is, the operation for retrieving the erase selected block is repeated while incrementing the address, and only when the block selected during data erase is retrieved, the verify readout is carried out with respect to the selected block. After the verify readout, if it is determined that the erase is sufficient, the retrieving operation is continued until the address to be erased reaches the final address. When the address to be erased reaches the final address, all of the data erasing operations are completed. After the verify operation, if it is determined that the erase is insufficient, erase is carried out again, and the selected block retrieval and the verify are repeated again.

By the way, as the capacity of an EEPROM increases, a memory cell array is often divided into a plurality of cell array regions. The plurality of cell array regions are usually formed in different wells. Also in this case, data erase can be carried out over the plurality of cell array regions to select an optional block therefrom to batch-erase the selected block. However, in the above described conventional data erase sequence, there is a problem in that it takes a lot of time to carry out the retrieving operation for the erase verify. The retrieving operation is repeated until the address of an address register reaches the final address, and the address of the address register is incremented in order to carry out the verify operation for the selected and erased block. Specifically, when the memory cell array is divided into two cell array regions, and when each of the cell array regions has 1024 blocks, it is required to carry out 2048 retrieving operations in total.

The time required to carry out all of the data erasing operations viewed from the outside of the chip is the sum of the net erase time, in which erase pulses are applied, the time required to carry out the operation for retrieving the selected block, and the time required to carry out the verify readout. Since the time required to carry out one retrieving operation is about hundreds of ns, the time required to retrieve all of the blocks to be erased approximates 1 ms. Since the net time required to erase data is in the range of from 1 ms to 2 ms, the percentage of the time required to carry out the retrieving operations to the whole erase time reaches tens %. This problem becomes more serious as the capacity of the EEPROM further increases.

SUMMARY OF THE INVENTION

It is therefore an object of the present invention to eliminate the aforementioned problems and to provide an EEPROM capable of shortening the time required to retrieve a selected block for a verify operation after data erase, to shorten the time required to carry out the whole data erase.

In order to accomplish the aforementioned and other objects, according to one aspect of the present invention, a non-volatile semiconductor memory device includes:

a memory cell array divided into a plurality of cell array regions, each of which includes a plurality of blocks, each of the blocks having electrically rewritable non-volatile memory cells arranged therein;

a data erasing part for selecting one or more of the blocks of the memory cell array to batch-erase data in the selected block(s) as an erased block(s) to be erased;

an erase information holding part, provided in each of the blocks of the memory cell array, for holding erase information indicating whether the block is one of the erased block(s);

a retrieving part for sequentially reading the erase information, which is held by the erase information holding part in each of the plurality of cell array regions, for every one of the blocks to detect the erased block(s), the retrieving part reading the erase information at the same timing for every one of the blocks in each of the cell array regions when the retrieving part reads the erase information from the erase information holding part; and an erase verify part for carrying out an erase verify for confirming an erased state of the memory cells with respect to the erased block(s), which are detected by the retrieving part, the erase verify part repeating a data erase operation with respect to the erased block(s) which are erased insufficiently, and the erase verify part carrying out the erase verify in parallel with respect to the erased block(s) which are detected on the basis of the erase information read at the same timing by the retrieving part.

According to another aspect of the invention, a non-volatile semiconductor memory device includes:

a memory cell array divided into a plurality of cell array regions, each of which includes a plurality of blocks, each of the blocks having electrically rewritable non-volatile memory cells arranged therein;

a data erasing part for selecting one or more of the blocks of the memory cell array to batch-erase data in the selected block(s) as an erased block(s) to be erased;

an erase information holding part, provided in each of the blocks of the memory cell array, for holding erase information indicating whether the block is one of the erased block(s);

a detecting part for reading the erase information, which is held by the erase information holding part in each of the plurality of cell array regions, to detect whether the erased block(s) exist in each of the cell array regions; and an erase verify part for carrying out an erase verify for confirming an erased state of the memory cells with respect to the erased block(s) in the cell array regions in which the presence of the erased block(s) is detected by the detecting part, the erase verify being carried out with respect to the erased blocks by sequentially reading the erase information for every one of the blocks, and a data erase operation being repeated with respect to the erased block(s) which are erased insufficiently.

According to another aspect of the present invention, a non-volatile semiconductor memory device includes:

a memory cell array divided into a plurality of cell array regions, each of which includes a plurality of blocks, each of the blocks having electrically rewritable non-volatile memory cells arranged therein;

a data erasing part for selecting one or more of the blocks of the memory cell array to batch-erase data in the selected block(s) as an erased block(s) to be erased;

an erase information holding part for holding cell array erase information indicating whether each of the cell array regions includes one of the erased block(s), for every one of the cell array regions;

a detecting part for reading the cell array erase information from the erase information holding part, to detect whether one of the erased block(s) exists in each of the cell array regions; and an erase verify part for carrying out an erase verify for confirming an erased state of the memory cells with respect to the erased block(s) in the cell array regions in which the presence of the erased block(s) is detected by the detecting part, the erase verify being carried out with respect to the erased blocks by sequentially reading the erase information for every one of the blocks, and a data erase operation being repeated with respect to the erased block(s) which are erased insufficiently.

Specifically, according to the present invention, in order to retrieve the block(s), which are selected during erase, during the verify, a common bus serving as a sense node for detecting the block selection is provided in each of the cell array regions of the memory cell array. In addition, a selected block detecting circuit is included for monitoring the potential of the common bus to detect whether the blocks are selected during the block retrieval.

Specifically, in this case, the potential of the common bus is determined by the on/off of a discharge path, which is controlled for every one of the blocks of each of the cell array regions by data held, a block address and a timing control signal, for discharging the common bus in the block(s) selected during the data erase.

According to the present invention, the time required to carry out the block retrieval can be shortened by retrieving a plurality of cell arrays simultaneously in parallel, in comparison with the conventional system for incrementing all of the addresses to sequentially detect the erased blocks in order to carry out the retrieval for the verify after data batch-erase. In addition, prior to the block retrieval for the verify operation, it is determined by simultaneously reading the erase flag whether the blocks selected during the erase exist in each of the cell arrays, and the block retrieval and verify are carried out with respect to the cell array in which the erased blocks exist, so that the time required to carry out the block retrieval can be shortened.

Furthermore, according to the present invention, the plurality of cell array regions, for which the block retrieval in the memory cell array is carried out simultaneously in parallel, may be separated from each other by, e.g., wells. In this case, a row decoder, a column decoder and a sense amplifier may be provided in each of the plurality of cell array regions so that the verify reading operation after the block retrieval can be carried out in parallel with respect to the plurality of cell array regions. Alternatively, according to the present invention, the plurality of cell array regions of the memory cell array may be formed in a single well so as to be separated from each other by only the assignment of address without being physically separated. In this case, if bit lines are continuously provided over the plurality of cell array regions and if a common sense amplifier is used, the verify reading operation after the block retrieval is sequentially carried out for every one of the plurality of cell array regions.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 8A is a block diagram of the second preferred embodiment of a NAND type EEPROM according to the present invention;

DESCRIPTION OF THE PREFERRED EMBODIMENTS

Referring now to the accompanying drawings, the preferred embodiments of the present invention will be described below.

First Preferred Embodiment

Figure 1:
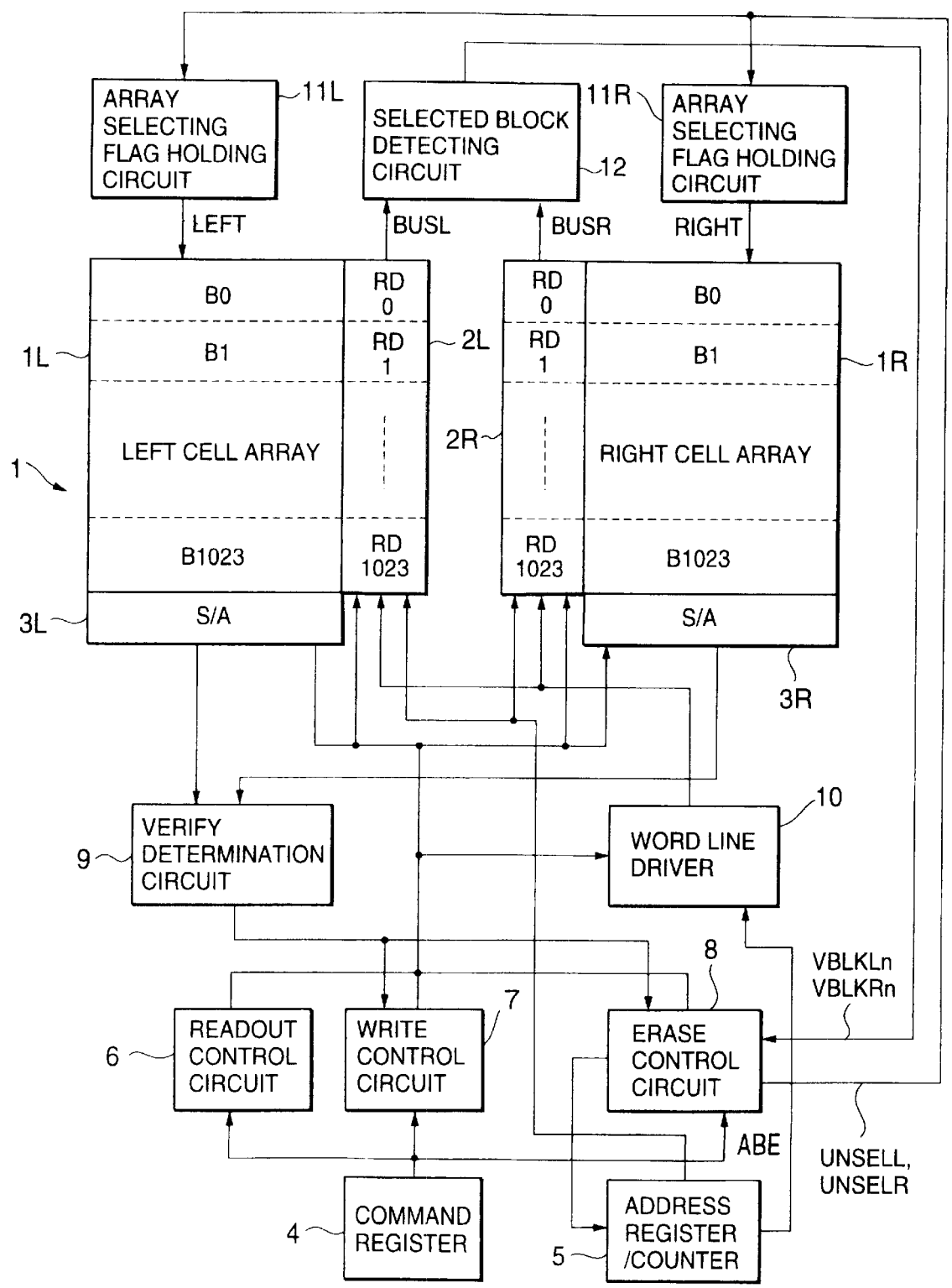
FIG. 1 is a block diagram of a preferred embodiment of a NAND type EEPROM according to the present invention.
Figure 2A:
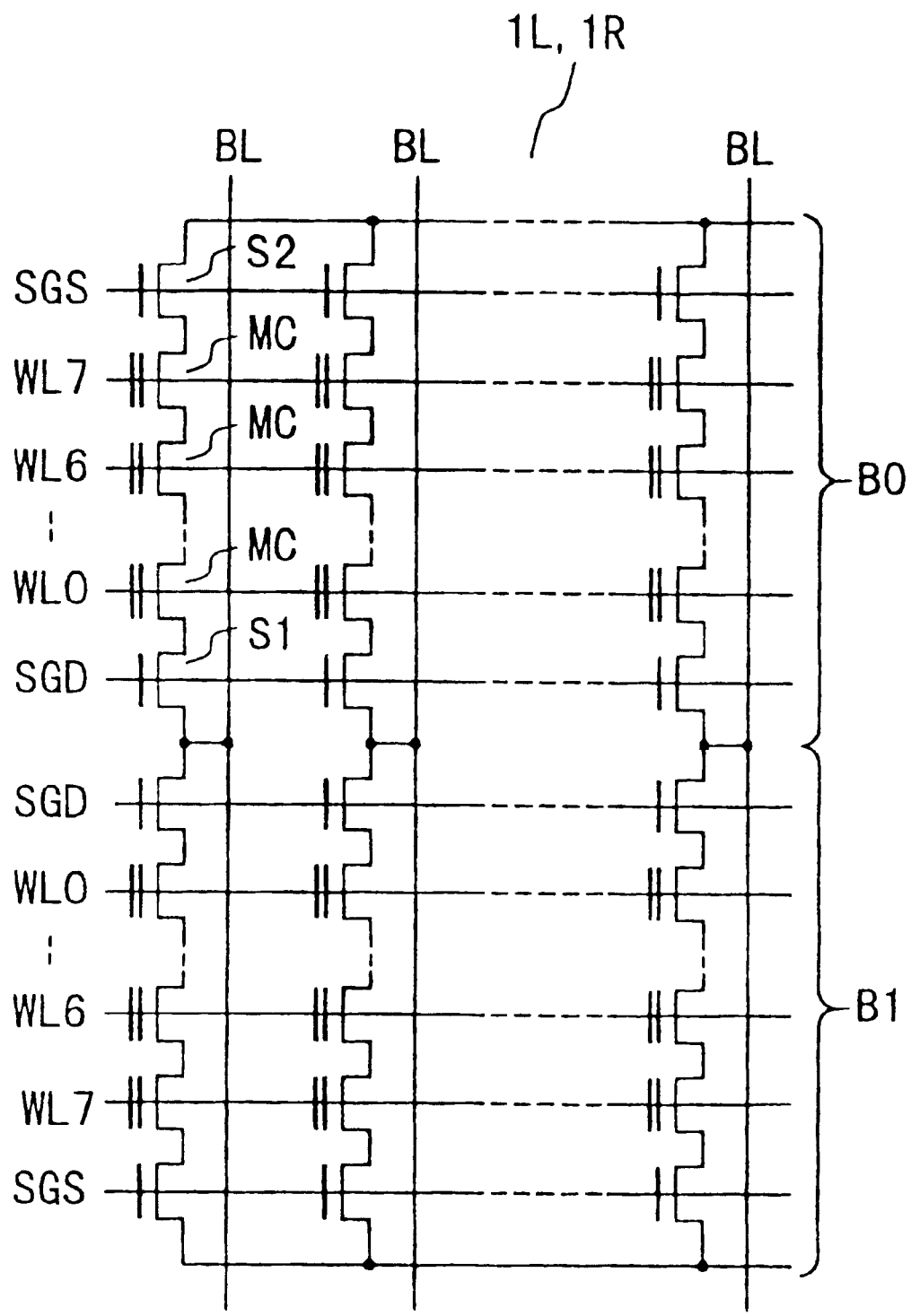
FIG. 2A is a circuit diagram showing an equivalent circuit of the first preferred embodiment of a memory array according to the present invention.

FIG. 1 is a block diagram of the first preferred embodiment of a batch-erasable NAND type EEPROM (flash memory) according to the present invention. In this preferred embodiment, a memory cell array 1 is divided into a left cell array 1L and a right cell array 1R. As shown in FIG. 2A, each of the cell arrays 1L and 1R comprises a NAND cell wherein a plurality of non-volatile memory cells MC are connected in series.

One end of the NAND cell is connected to a bit line BL via a selecting gate transistor S1 driven by a selecting gate line SGD, and the other end thereof is connected to a common source line via a selecting gate transistor S2 driven by a selecting gate line SGS. The range of the NAND cell, e.g., the range of eight word lines WL0 through WL7 in the example of FIG. 2A, corresponds to each of blocks B0, B1, . . . , each of which serves as a data erase unit. In the example of FIG. 1, each of the cell arrays 1L and 1R comprises 1024 blocks.

Figure 2B:
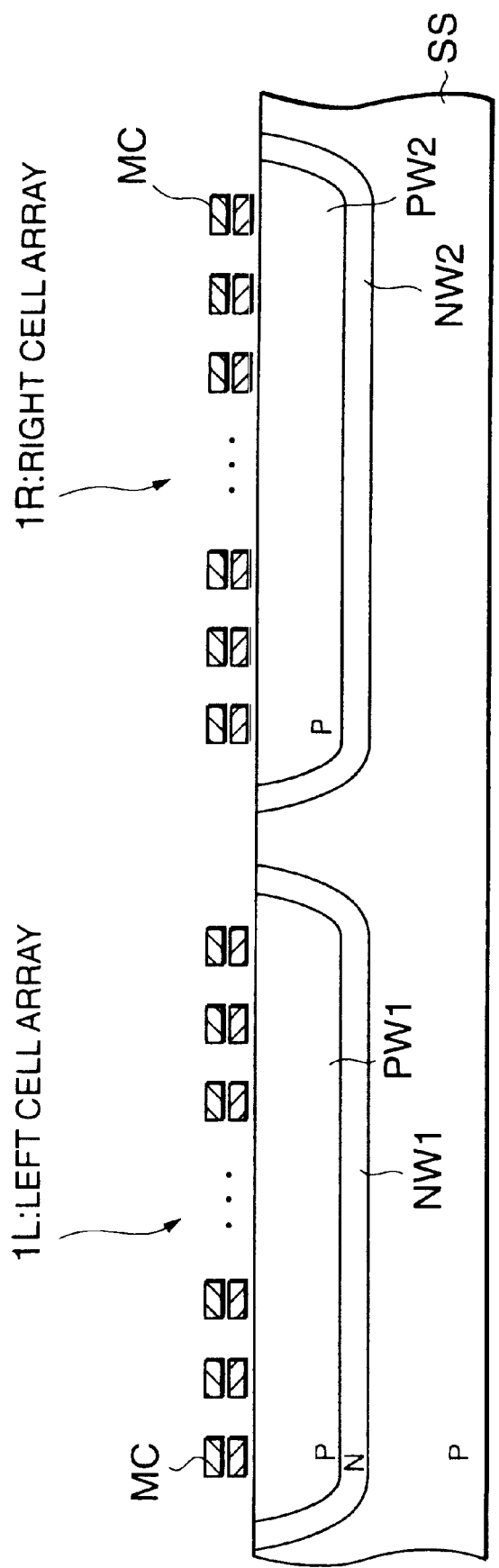
FIG. 2B is a sectional view schematically showing the first preferred embodiment of a non-volatile semiconductor memory device according to the present invention wherein two cell arrays are formed in different wells.

Furthermore, the cell arrays 1L and 1R are formed in separate p-type wells, respectively. FIG. 2B is a schematic diagram showing a cross section of a non-volatile semiconductor memory device wherein the cell arrays 1L and 1R are formed. As shown in FIG. 2B, n-type wells NW1 and NW2 are formed on the surface of a p-type semiconductor substrate SS. P-type wells PW1 and PW2 are formed on the surfaces of the n-type wells NW1 and NW2. The left cell array 1L is formed on the p-type well PW1, and the right cell array 1R is formed on the p-type well PW2. However, the impurity type may be the reverse type thereof.

The cell arrays 1L and 1R are provided with row decoders 2L and 2R for selectively driving word lines, and sense amplifiers 3L and 3R for sensing read data and latching write data, respectively. A command register 4 captures and decodes a command for indicating data readout, writing (program), and erase from the outside. An address register/counter 5 captures an external address. A readout control circuit 6, a write control circuit 7 and an erase control circuit 8 control data readout, writing and erase, respectively, on the basis of the command captured into the command register 4, and the address captured into the address register 5.

Figure 3:
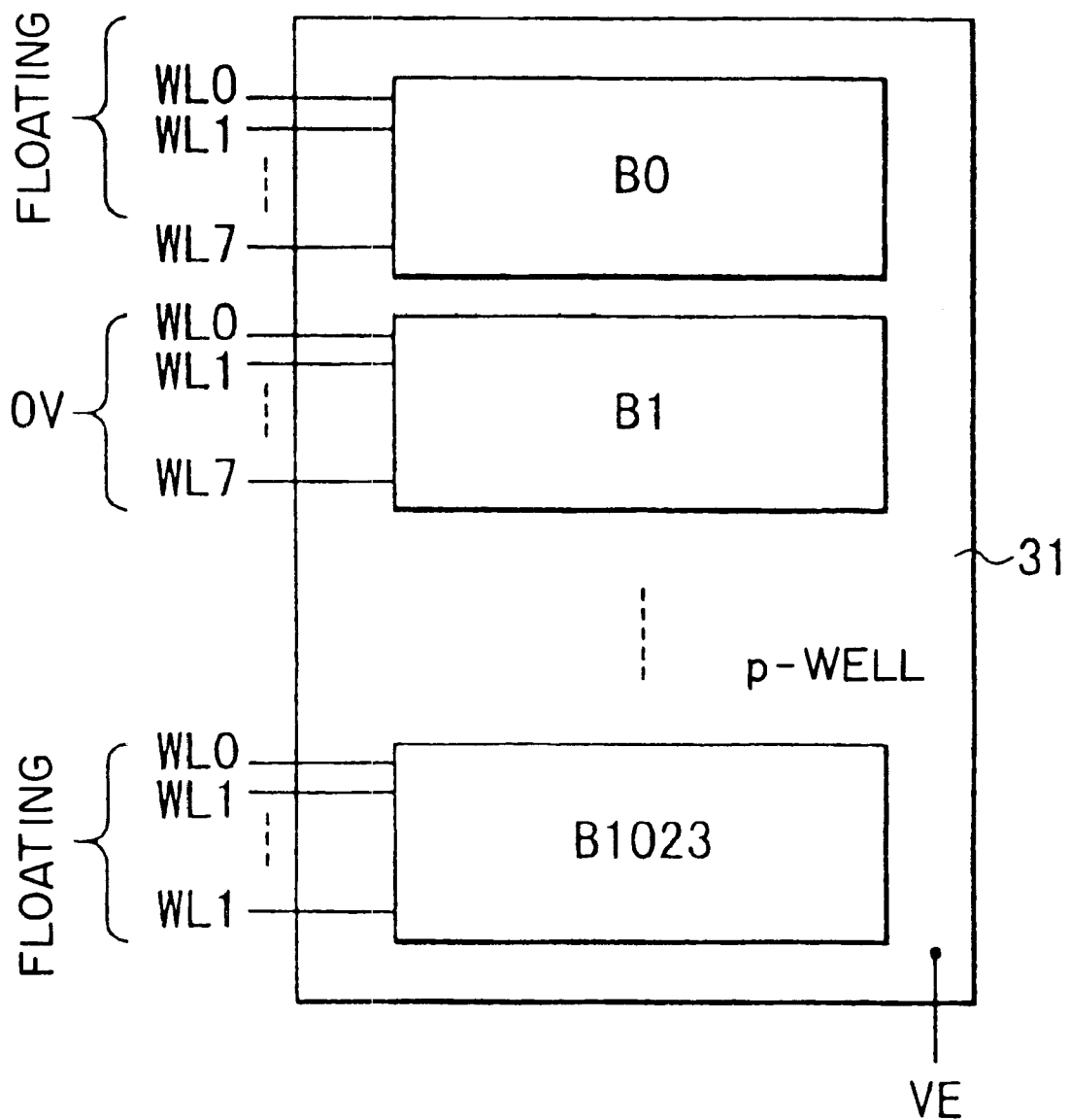
FIG. 3 is a schematic diagram showing the relationship between potentials for data erase in the first preferred embodiment.

A word line driver 10 supplies a required word line driving voltage to word lines selected by the row decoders 2L and 2R, in accordance with the data readout, writing and erase. During data writing, a boosted writing voltage VP produced by a booster circuit (not shown) is applied to the word lines. During data erase, as shown in FIG. 3, a boosted erase voltage VE is applied to the p-type wells PW1 and PW2 of the cell array, 0V is applied to the word lines of the selected block (B1 in the case of FIG. 3), and the word lines of unselected blocks are allowed to be floating.

The array selecting flag holding circuits 11L and 11R hold selecting flags LEFT="H" and RIGHT="H" indicating that both of the left and right cell arrays 1L and 1R are selected, when an erase command ABE is inputted. Specifically, assuming that the left and right cell arrays 1L and 1R are determined by the "H" and "L" of the most significant address Am of address Ar0 through Arn, the selecting flags LEFT="H" and RIGHT="H" are held during erase as OR logical data of the Arn and its complementary signal/Arn. These selecting flags LEFT and RIGHT are "L" with respect to the unselected cell arrays during retrieval in the verify operation after erase. That is, the selecting flags LEFT and RIGHT are "L" with respect to the unselected cell arrays by signals UNSELL and UNSELR indicating that the cell arrays, to which the blocks belong, are unselected. Therefore, the signals UNSELL and UNSELR are outputted from the erase control circuit 8 for every block.

The selected block detecting circuit 12 is a circuit for detecting the presence of selection of each of the cell arrays 1L and 1R for every block by monitoring common buses BUSL and BUSR provided in the respective cell arrays IL and 1R. Although this circuit will be described in detail later, each of the common buses BUSL and BUSR is commonly connected to a latch circuit 41 (see FIG. 4 ) arranged in each block of a corresponding one of the cell arrays 1L and 1R. Each of the latch circuits 41 holds block selecting information during data erase. Therefore, the common buses BUSL and BUSR are sense nodes in the selected block retrieval for the verify which will be carried out later, on the basis of the block selecting information for data erase. The selected block detecting circuit 12 monitors the common buses BUSL and BUSR during the selected block retrieval after data erase, and outputs signals VBLKLn and VBLKRn indicative of the selected/unselected state of the blocks in the respective cell arrays 1L and 1R. Specifically, when these signals VBLKLn and VBLKRn are "H", these signals indicate that the corresponding blocks are verify disable.

Figure 4:
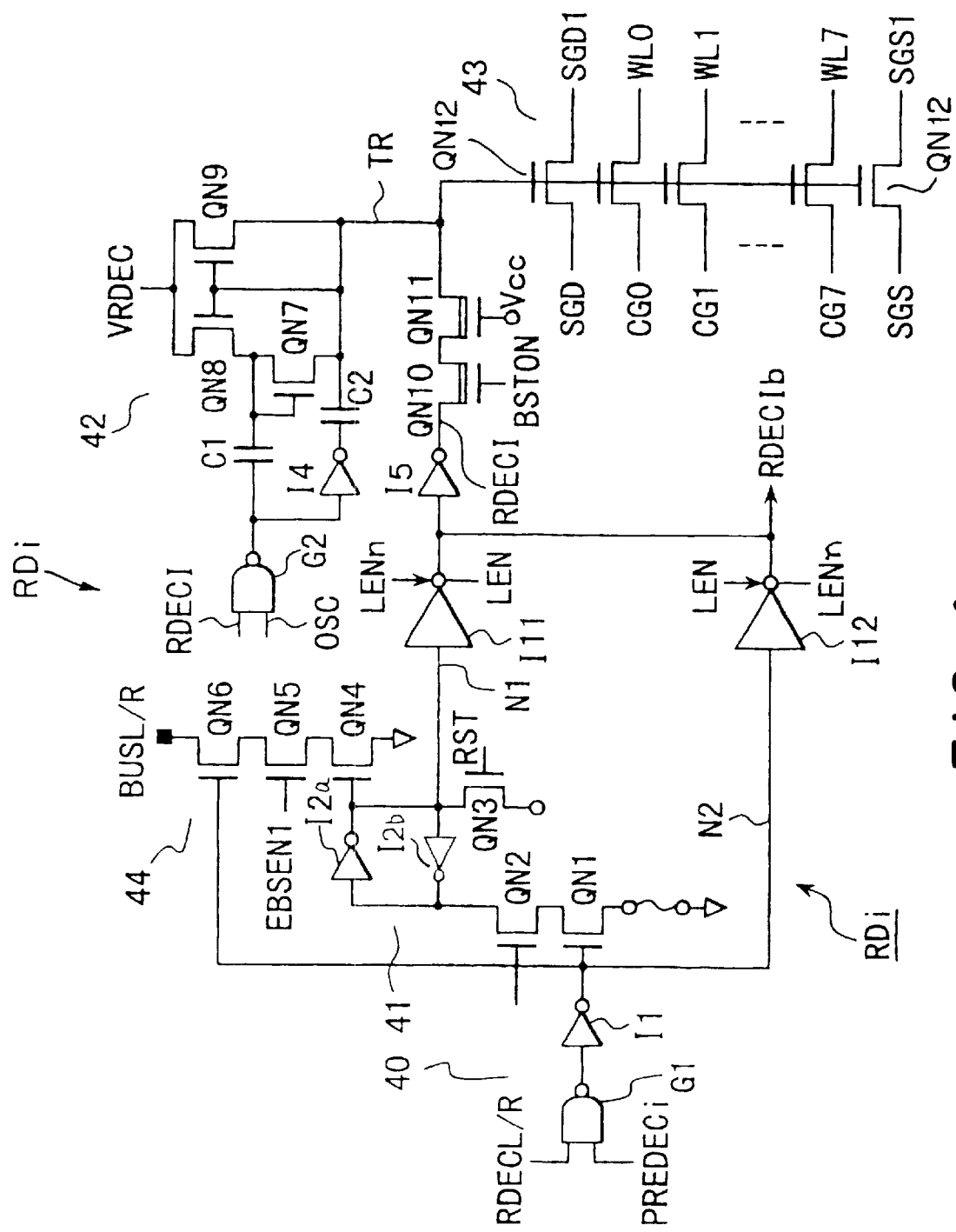
FIG. 4 is a circuit diagram of a row decoder in the first preferred embodiment.

FIG. 4 shows the construction of a block selecting decoder RDi of each of the row decoders 2L and 2R for selectively driving the word lines. A block decoding part 40 carries out a coincidence detection of a row decoder activating signal RDECL/R with a predecode output PREDECi by means of a NAND gate G1 and an inverter I1. If a block is selected, the output of the NAND gate G1 is "L". The latch 41 comprising inverters 12a and 12b inversely connected in parallel is an erase flag holding circuit for holding an erase flag indicating that the block is selected during data erase. That is, if an address is inputted from the outside of the chip before erasing the block, the node N1 of the latch 41 is "H" with respect to the selected block, and this is held over the whole period for data erase.

The portions of an NMOS transistor QN4 controlled by the node N1 of the latch 41, an NMOS transistor QN5 receiving a timing control signal EBSEN1, and an NMOS transistor QN6 receiving the output of the decoding part 40 constitute a discharge path 44 for the common bus BUSL/R. As described above, each of the common buses BUSL and BUSR is commonly provided in each of the cell array regions, and serves as a sense node for detecting whether the block is selected during data erase in the verify operation. The common buses BUSL and BUSR are connected to the selected block detecting circuit 12 as shown in FIG. 1. When the block is selected and when the timing control signal EBSEN1 is "H", the NMOS transistors QN4 through QN6 are turned on, so that the discharge path 44 causes the common buses BUSL and BUSR to discharge.

The node N1 of the latch 41 is connected to a driving voltage transfer terminal TR via a clocked inverter I11, an inverter 15 and depletion type NMOS transistors QN10 and QN11. On the other hand, the output of the inverter 11 is connected to the terminal TR via another clocked inverter I12, the inverter 15 and the transistors QN10 and QN11. The clocked inverters I11 and I12 of these two paths are controlled by activating signals LEN and LENn so as to be complementarily turned on during data erase and during other operations. That is, during data erase, the clocked inverter I11 is turned on, so that the output "H" of the latch 41 is transferred to the transfer terminal TR. Since the transistors QN10 and QN12 are depletion type transistors, the "H" (=VCC) of the output RDECI of the inverter I5 is transferred to the terminal TR without decreasing its potential.

A transfer switch circuit 42 is operated during data readout and writing (including verify) for transferring a driving voltage or a power supply voltage) VDREC, which is boosted by a booster circuit (not shown), to the terminal TR. That is, when the block is selected, the output RDECI of the inverter I5 is "H", and this enters a NAND gate G2. A clock signal OSC for charge pump operation enters another input terminal of the NAND gate G2. Therefore, when the block is selected, the clock signal OSC is supplied to the transfer switch circuit 42 via the NAND gate G2. Thus, the transfer switch circuit 42 transfers a voltage VRDEC+α (α: the threshold voltage of an NMOS transistor QN9) to the terminal TR by the charge pump function. By the driving voltage transferred to the terminal TR, the transistor of a word line drive stage 43 is turned on. Thus, a required driving voltage applied to word line control terminals CG0 through CG7 and selecting gate terminals SGD and SGS is applied to the word lines WL and selecting gate lines SGD1 and SGD2 without decreasing its potential.

Figure 5:
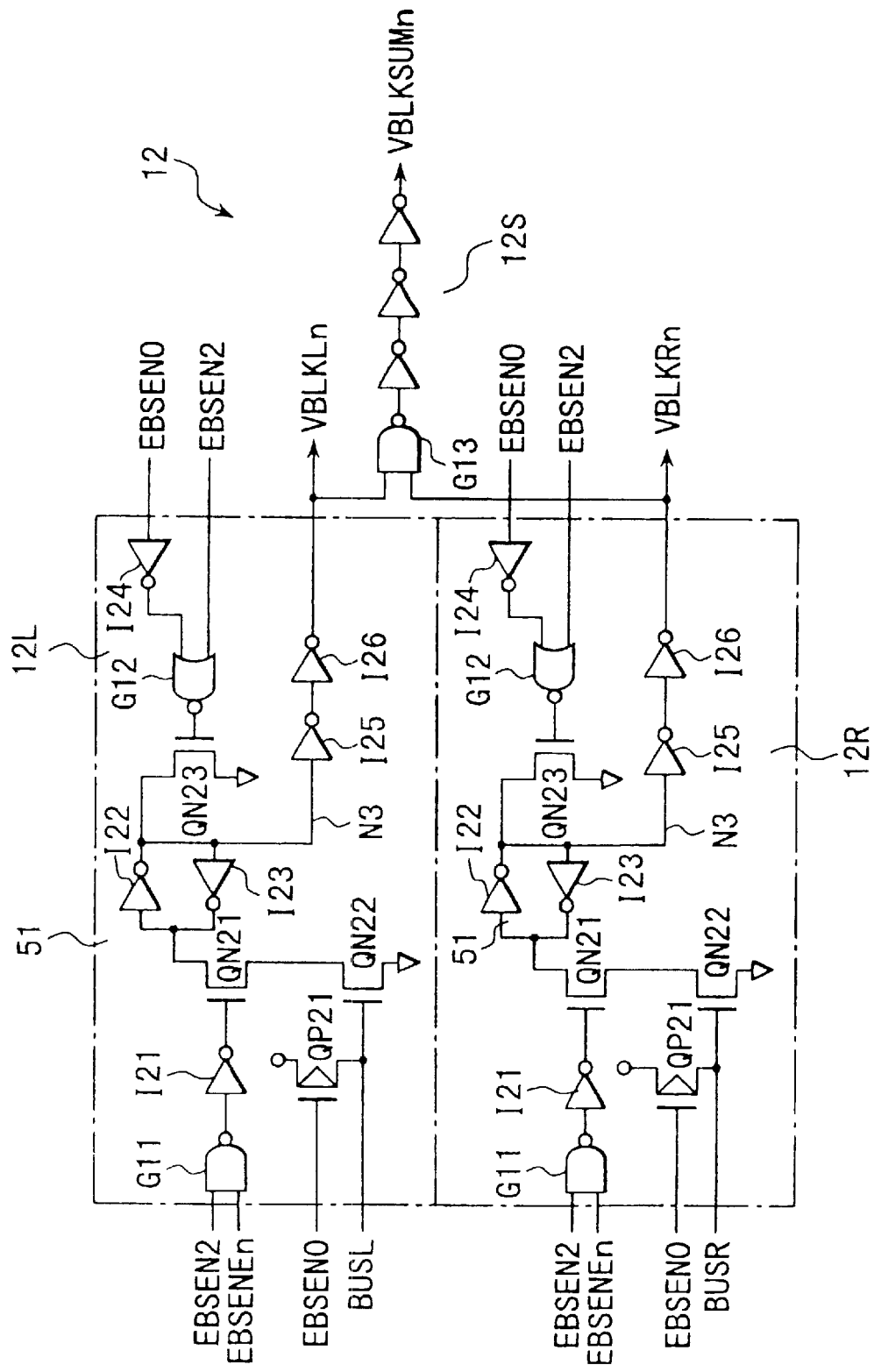
FIG. 5 is a circuit diagram of a selected block detecting circuit in the first preferred embodiment.

FIG. 5 shows the construction of the selected block detecting circuit 12 shown in FIG. 1. The selected block detecting circuit 12 has detecting circuits 12L and 12R having the same construction provided in the cell arrays 1L and 1R, respectively. Each of the detecting circuits 12L and 12R has an NMOS transistor QN22 for detecting the presence of discharge of a corresponding one of the common buses BUSL and BUSR of each block of the cell array, and a latch 51 for holding the detected results. Each of the detecting circuits 12L and 12R is controlled by timing control signals EBSEN0 and EBSEN2, which are produced from the erase control circuit 8 during data erase to sequentially become "H" every retrieval loop, and by a timing control signal EBSENEn for deactivating the circuit at the final timing every loop.

Before the timing control signal EBSEN0 for determining the start of the retrieving operation becomes "H", a PMOS transistor QP21 remains turned on, and the common buses BUSL and BUSR are charged to be "H" (=VCC). At this time, the NMOS transistor QN22 remains turned on. During the retrieving operation, the control signal EBSENEn="H". If the timing signal EBSEN0 first becomes "H" in each retrieval loop, the PMOS transistor QP21 is turned off, and the charge operations of the common buses BUSL and BUSR are stopped. Simultaneously, the output of a NOR gate G12 becomes "H", so that the NMOS transistor QN23 is turned on to reset the node N3 of the latch 51 to be "L" (=VSS).

Then, when the timing control signal EBSEN2 becomes "H", the output of a NAND gate G11 becomes "L", so that the NMOS transistor QN21 is turned on. Thus, data of the latch 51 are determined in accordance with the presence of discharge of the common buses BUSL and BUSR. That is, if the block is unselected, the common bus BUSL or BUSR remains "H", and both of the NMOS transistors QN21 and QN22 are turned on, so that the node N3 of the latch 51 becomes "H". Thus, both of control signals VBLKLn and VBLKRn become "H", and this indicates that the block is unselected. If the block is unselected, the node N3 of the latch 51 holds "L".

Moreover, the coincidence of the outputs of the two detecting circuits 12L and 12R is detected by a coincidence detecting circuit 12S having a NAND gate G13. When both of the control signals VBLKLn and VBLKRn are "H", a control signal VBLKSUMn being "H" is outputted. That is, the control signal VBLKSUMn="H" indicates that both of the retrieved blocks are unselected.

In this preferred embodiment, the retrievals of the erased blocks in the verify operation after data erase are simultaneously carried out in parallel with respect to the left and right cell array 1L and 1R. In the address Ar0, Ar1, . . . , Arn of the cell arrays 1L and 1R, "0" and "1" of the most significant address Arn indicate the left and right cell arrays 1L and 1R, and the other addresses Ar0, Ar1, . . . , Arn-1 are common to the right and left, so that the retrievals of the erased block of the left and right cell arrays 1L and 1R are simultaneously carried out in parallel by the lower address Ar0 through Arn-1 except for the most significant address Arn.

Figure 6:
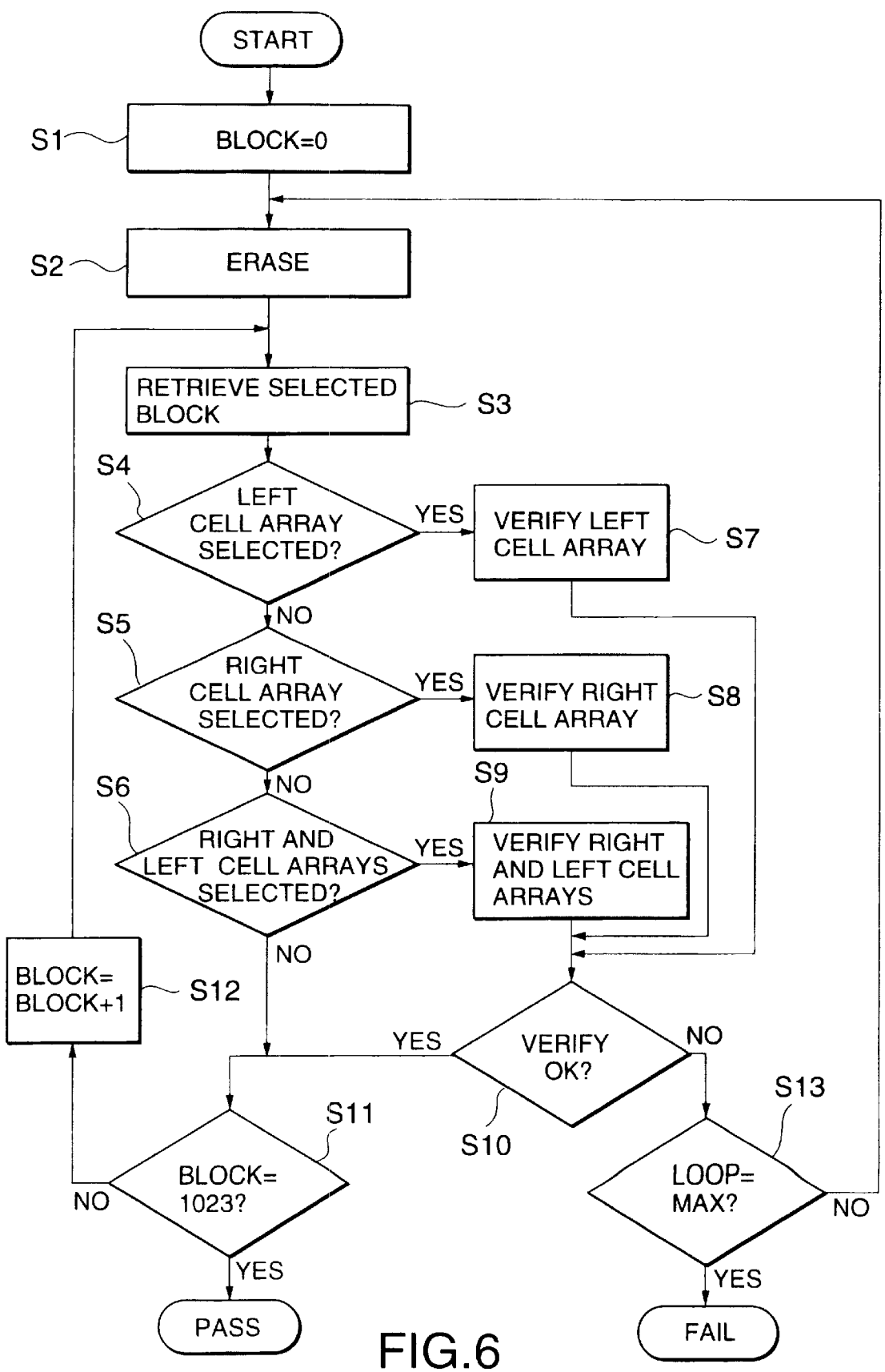
FIG. 6 is a flow chart showing a data erasing operation in the first preferred embodiment.

FIG. 6 is a flow chart showing a data erasing operation in this preferred embodiment. First, the address of an erased block is initialized as BLOCK=0 (S1). This variable BLOCK is a variable used for verify processing which will be carried out later. Then, a usual data erasing operation is carried out (S2). That is, on the basis of an erase command, a batch erase is carried out for every block selected by an external address. After a predetermined erase time elapses, a retrieving operation for a verify operation is carried out (S3).

With respect to the first block BLOCK=0, it is determined whether only the left cell array 1L has been selected during erase (S4). If it is YES, verify readout is carried out with respect to only the left cell array 1L (S7). If only the left cell array 1L is not selected, it is determined whether only the right cell array 1R has been selected (S5). If it is YES, verify readout is carried out with respect to the right cell array 1R (S8).

Moreover, if both of the determined results at steps S4 and S5 are NO, it is determined whether the left and right cell arrays 1L and 1R have been simultaneously selected (S6). If it is YES, verify readout is carried out simultaneously with respect to the left and right cell arrays 1L and 1R (S9).

If the block BLOCK=0 is unselected with respect to both of the left and right cell arrays 1L and 1R, it is determined whether ithe procedure has reached the final address (block BLOCK=1023) (S11). If it has not reached the final address, an erased address is updated (S12). That is, BLOCK is counted up by 1. Then, the above described process from step S3 is repeated until BLOCK=1023.

On the other hand. after the verify readout is carried out at steps S7, S8 and S9, it is determined whether the erase is sufficient (S10). If the determined result of the verify readout is OK, the above described processing from step S11 is carried out. On the other hand, if the determined result is NO at S10, the erase and verify are repeated until it is determined that the number of loops reaches a set number (S13). If the erase is still insufficient after the number of loops reaches the set number, the routine ends as erase failure.

Figure 7A:
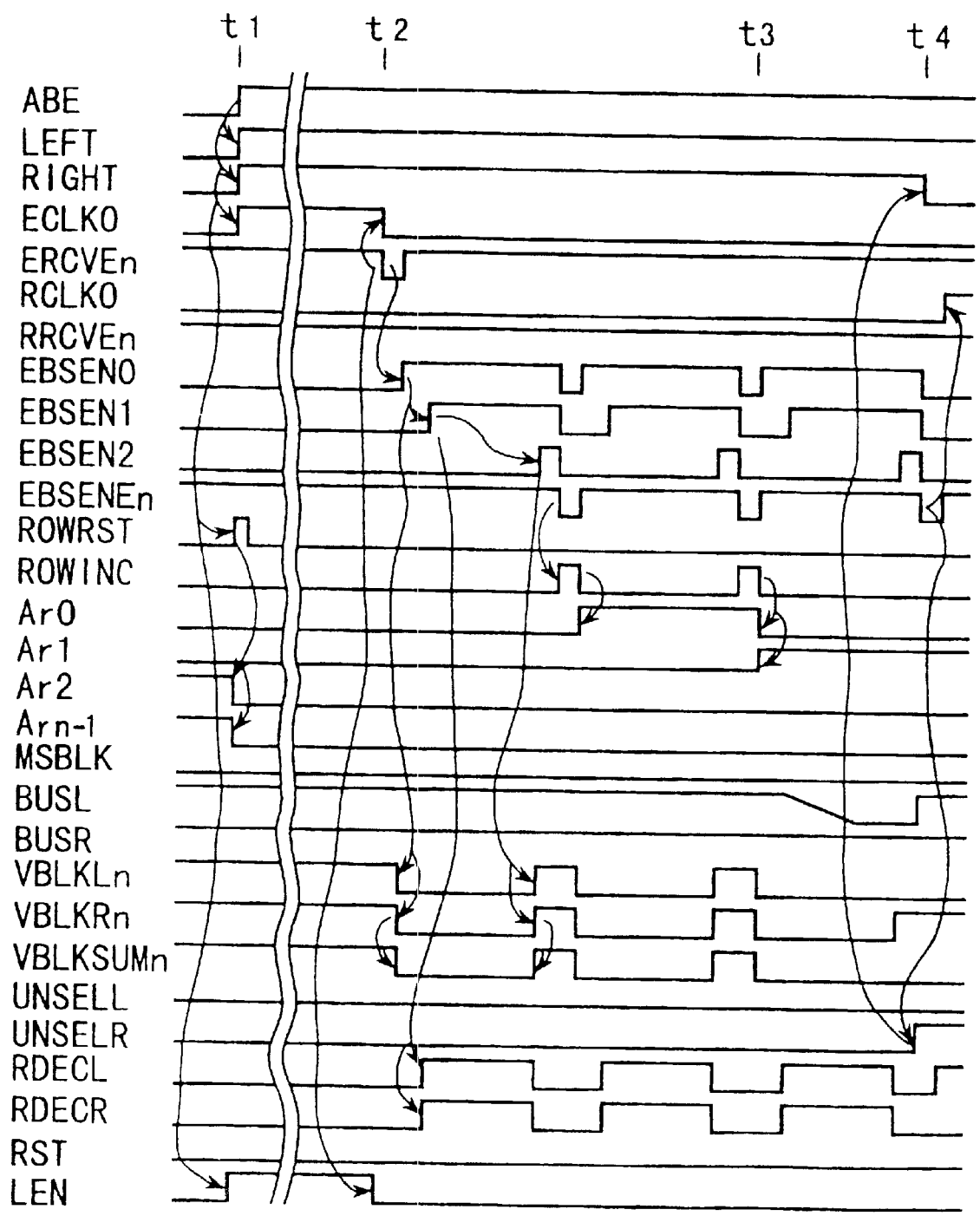
FIG. 7A is a timing chart for data erase in the first preferred embodiment.
Figure 7B:
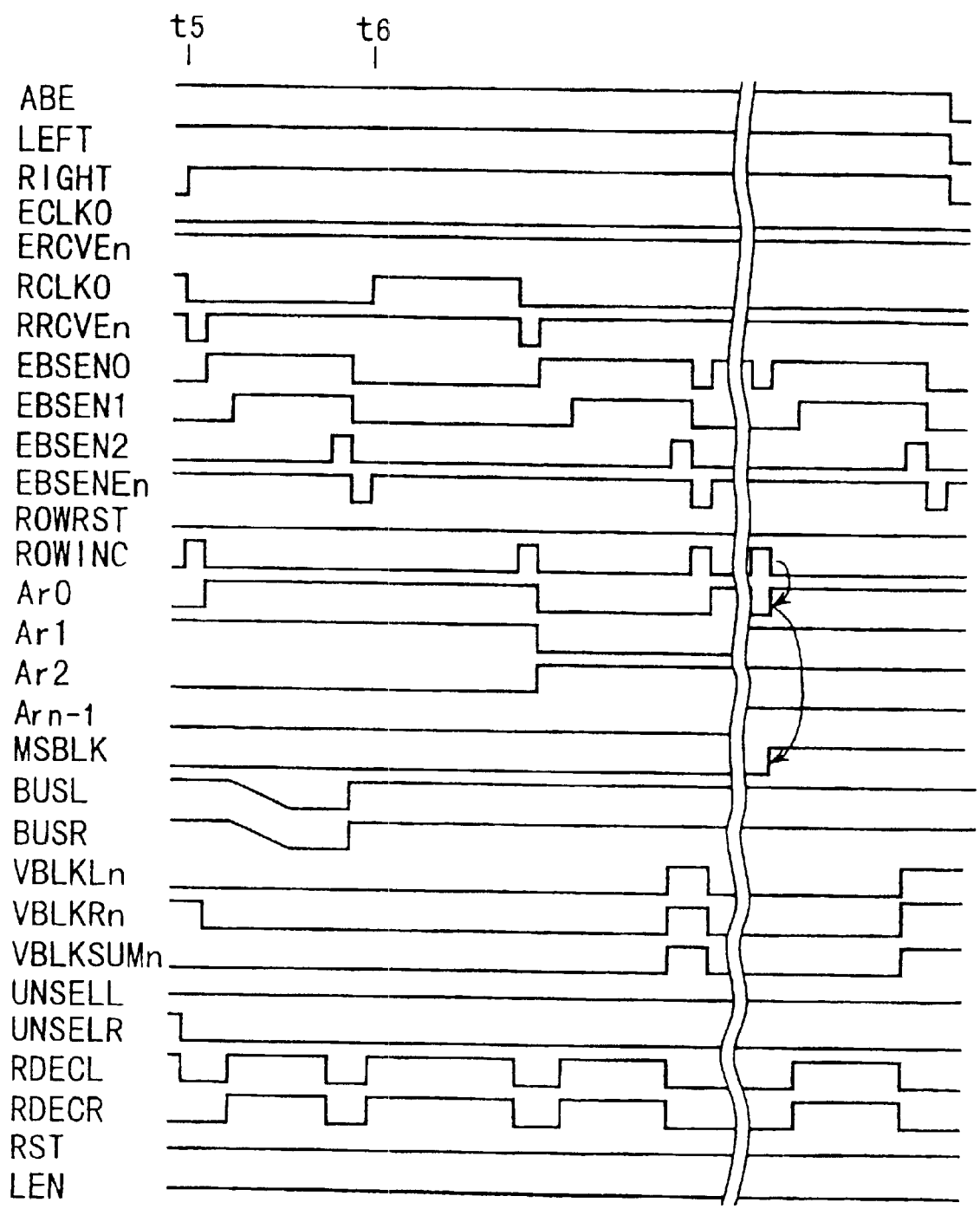
FIG. 7B is a timing chart (continued from FIG. 7A) for data erase in the first preferred embodiment.

FIGS. 7A and 7B are timing charts for a data erasing operation of an EEPROM in this preferred embodiment. If a block selecting address to be erased and an erase executing command are inputted, the erase command flag ABE becomes "H", so that an erasing operation is started (t1). That is, the address counter of the block to be erased is initialized by an initializing pulse ROWRST, so that all of the addresses Ar0, Ar1, . . . , Arn become "L". Simultaneously, an internal signal ECLK0 for controlling the erase operation becomes "H" to start the erase operation.

In the case of this preferred embodiment, if the erase command is inputted, both of the selecting flags LEFT and RIGHT of the two cell arrays 1L and 1R become "H", so that the two cell arrays are in a selected state during the erase operation. Then, the control signal LEN becomes "H", and the clocked inverter I11 of FIG. 4 is active, so that RDECI becomes "H" with respect to the selected block by the data held by the latch 41. During erase, a signal BSTON of FIG. 4 is VCC, so that VCC is transferred to the terminal TR via the transistors QN10 and QN11. Therefore, all of the NMOS transistors QN12 of the word line drive stage 43 are turned on. On the other hand, since the voltages of the terminals CG0 through 7 of FIG. 4 become 0V by the word line driver 10 shown in FIG. 1, the voltages of the word lines of the selected block are controlled to be 0V, and the memory cells therein are batch-erased.

In the erase operation, a selected optional number of blocks of the blocks B0 through B1023 of the two cell arrays 1L and 1R are batch-erased. After a predetermined erase time elapses, a timing signal ERCVEn indicative of the end of the erase operation is produced, so that the erase operation ends (t2).

After the erase operation ends, an operation for retrieving a block to be erased for verify is carried out. In the case of this preferred embodiment, since the selecting flags LEFT and RIGHT are "H" in the two cell arrays 1L and 1R, two erased blocks in the left and right cell arrays 1L and 1R having the same address of any one of Ar0 through Arn-1 are simultaneously retrieved in parallel. If one retrieving operation is completed, the address is sequentially incremented by an increment signal ROWINC produced in synchronism with the timing control signal EBSENn.

After the retrieval, if both of the corresponding blocks of the two cell arrays are unselected, both of the output control signals VBLKLn and VBLKRn from the selected block detecting circuit 12 are "H" by the timing control signal EBSEN2, and this is latched by the erase control circuit 8. As a result, the address is subsequently updated to continue the retrieval without the need of verify. In the example of FIG. 7A, this state is continued until time t2 to t3.

After the retrieval, if it is determined that the blocks of any one of the cell arrays are in a selected state, any one of the control signals UNSELL and UNSELR for deactivating the unselected cell array becomes "H". In FIG. 7A, the blocks of only the left cell array 1L are in a selected state at an address (t3) of Ar1="H", and the common bus BUSL is discharged. Thus, a signal UNSELR="H" for deactivating the right cell array 1R is produced at the trailing edge (t4) of the timing control signal EBSENEn. As a result, the selecting flag of the right cell array 1R becomes RIGHT="L". Until time t5 shown in FIG. 7B, at which this state is continued, the right cell array 1R is deactivated. During this, the control signal VBLKLn indicative of the deactivation of the blocks of the left cell array 1L does not rise, so that the verify operation is carried out in only the left cell array 1L.

At the address after the time t5 of FIG. 7B, two corresponding blocks of the left and right cell arrays 1L and 1R are simultaneously selected, and both of the common buses BUSL and BUSR are discharged. In response thereto, at time t6, at which the timing signal EBSENEn falls, both of the control signals VBLKLn and VBLKRn are "L". Therefore, the control signal VBLKSUMn is also held to be "L" (i.e., the selected state), and the selecting flags LEFT and RIGHT are held to be "H". In addition, both of the control signals UNSELL and UNSELR are held to be "L" to indicate to be verify enable. Thus, the verify operations in the selected blocks are carried out in parallel in the left and right cell arrays 1L and 1R.

Thereafter, the same verify operation as the retrieval is repeated until all of the address Ar0 through Arn-1 become "H", i.e., until 1024 blocks are selected in each of the cell arrays 1L and 1R in the case of this preferred embodiment.

Conventionally, until all of the addresses Ar0 through Arn become "H", the retrieval and verify of the erased blocks are carried out to complete the erase operation. On the other hand, in this preferred embodiment, as described above, the retrievals are simultaneously carried out in parallel with respect to the left and right cell arrays 1L and 1R selected by the "H" and "L" of the most significant address Arn, and the time required for all of the addresses Ar0 through Arn-1 to become "H" is the time required to carry out the retrieval, so that the time required to carry out the retrieval is shortened to be half of that in the conventional case. Thus, the time required to carry out the whole data erase can be shortened. In addition, when the corresponding blocks of both of the right and left cell arrays are selected to be erased, the verify operation corresponding thereto is simultaneously carried out. This also shortens the whole erase time.

In the above described preferred embodiment, the number of the cell arrays has been two. However, the present invention should not be limited thereto. Even if the memory cell array comprises a plurality of optional cell array regions, it is possible to simultaneously retrieve the plurality of cell array regions in parallel by the same technique, and it is possible to obtain the same effects. In particular, as the number of the cell arrays increases, the effect of the shortening of the time required to carry out the retrieval increases.

Figure 7C:
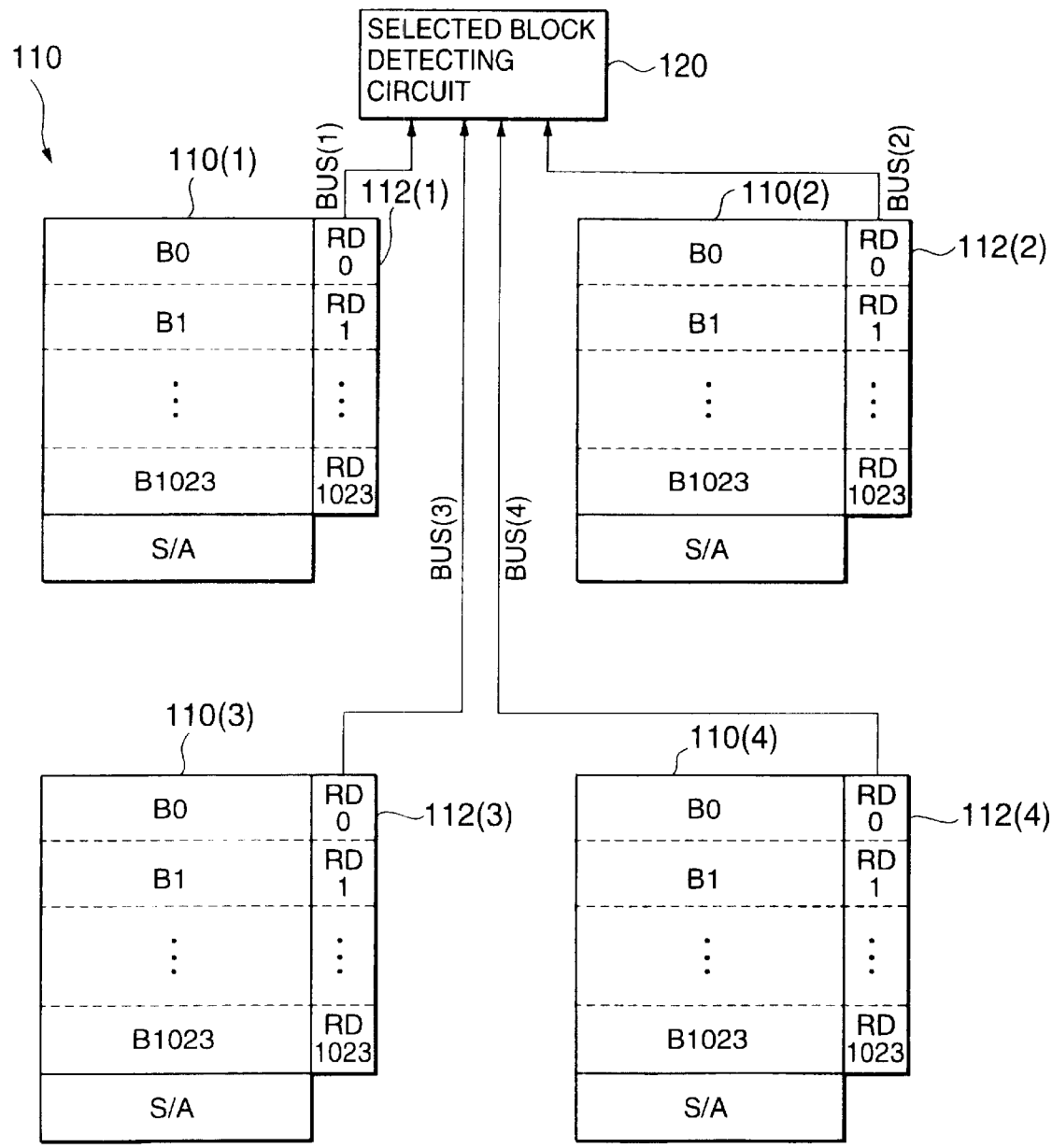
FIG. 7C is a block diagram showing a construction wherein four cell array regions are provided in one memory cell array.

For example, FIG. 7C shows a case where one memory cell array 110 comprises four cell array regions 110(1) through 110(4). In FIG. 7C, in the retrieving operation for verify, the selected block detecting circuit 120 sequentially retrieves whether the blocks B0, B1, . . . , B1023 are selected from each of the cell array regions 110(1) through 110(4) during erase. That is, information relating to the erase flag is read out from the latch circuit 41 of each of the row decoders 112(1) through 112(4) at the same timing with respect to the four blocks, to be incorporated into the selected block detecting circuit 120 via the common buses BUS(1) through BUS(4). Then, the selected block detecting circuit 120 identifies whether the block is selected during erase, on the basis of the four erase flags.

Second Preferred Embodiment

FIG. 8A is a block diagram of the second preferred embodiment of a non-volatile semiconductor memory device according to the present invention. As shown in FIG. 8A, the non-volatile semiconductor memory device in this preferred embodiment has the same structure as that in the above described first preferred embodiment, and has two cell arrays 1L and 1R.

Figure 8B:
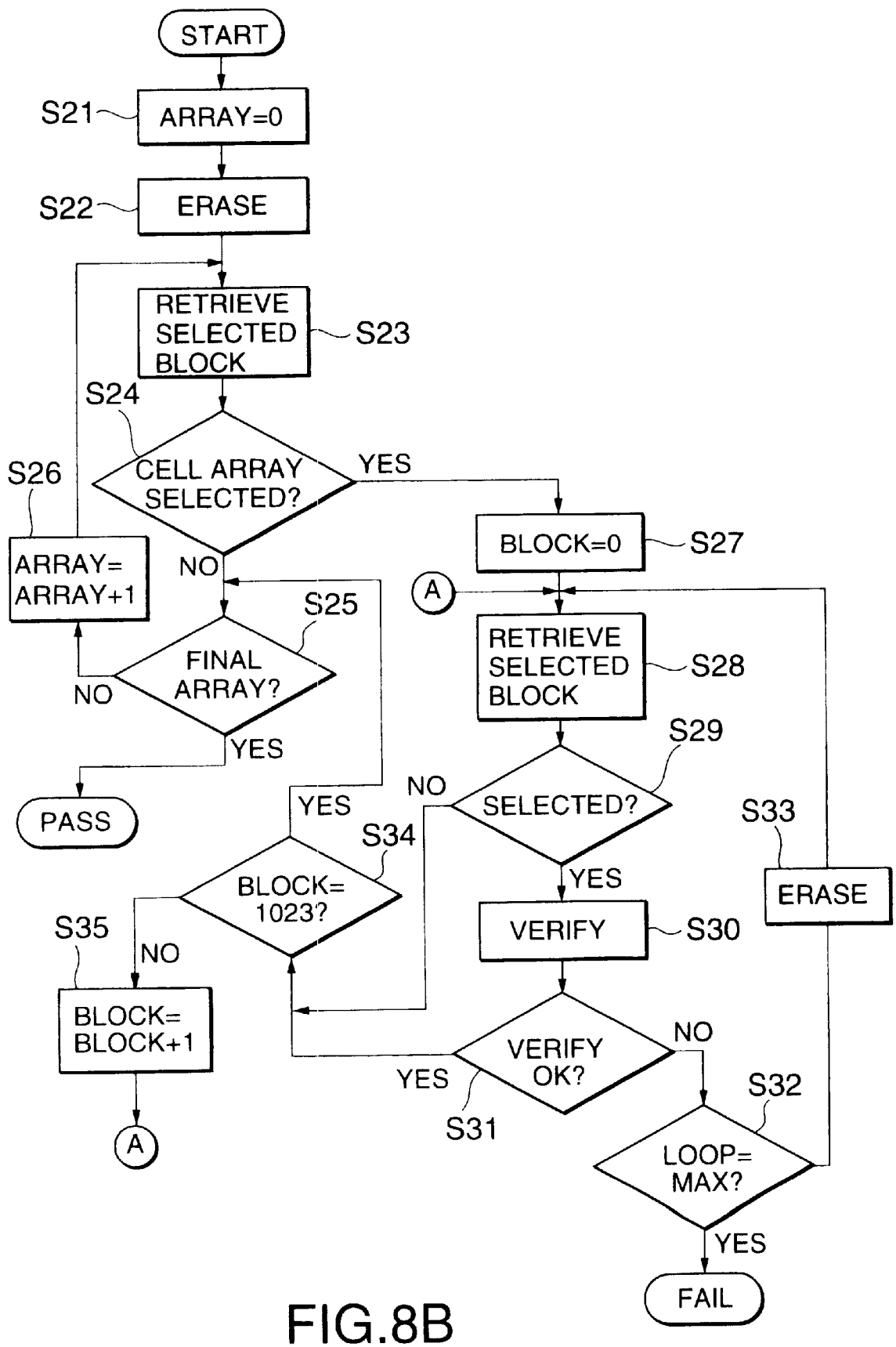
FIG. 8B is a flow chart showing a data erasing operation in the second preferred embodiment.

FIG. 8B is a flow chart showing data erase in the second preferred embodiment. In this preferred embodiment, with respect to a plurality of cell arrays, the retrieval for the presence of an erased block for every array precedes. Then, the retrieval and verify of the selected block are carried out with respect to only a cell array in which the erase selected block exists, similar to the conventional case, and the operation for retrieving the selected block is not carried out with respect to a cell array in which the erase selected block does not exist. Thus, the time required to carry out the retrieving operation is shortened.

As shown in FIG. 8B, the address of a plurality of cell arrays are first initialized as ARRAY=0 (S21) to erase data (S22). It is the same as the preceding preferred embodiment to batch-erase data of selected blocks with respect to all of the cell arrays. Thereafter, with respect to the first cell array indicated by ARRAY=0, the selected block is retrieved (S23). In this retrieval of the selected block, the erase flags held by the latch 41 of FIG. 4 of each block in the cell array are batch-read to determine whether the selected block exists in the cell array. If the selected block does not exist in the cell array, NO is determined at step S24, and then, it is determined whether the cell array is the final cell array (S25). If it is not the final cell array, the address of the cell array is updated (S26), and the processing from step S23 is repeated. Thus, the retrieval whether at least one block selected during the erase operation exists in the cell array is repeated until the retrieval of the final cell array is completed.

If it is determined at step S24 that the cell array is selected, the block address BLOCK is initialized (S27), and the block retrieval and verify operations are carried out with respect to the cell array while incrementing the block address. That is, the selected block retrieval is carried out (S28), and it is determined whether the retrieved block is selected to be erased (S29). If it is YES, the verify readout is carried out (S30). If the block is unselected, the block address is updated (S35), and the routine returns to the selected block retrieving step S28. After it is determined that the retrieval of all of the blocks is completed (S34), the routine goes to step S25.

After the verify readout, it is determined whether the erase is sufficient (S31). If the determined result is YES, the block address is updated (S35), and the same retrieval and verify are repeated. If the verify determination is NO, erase is carried out again (S33), and the verify determination is repeated. If it is determined that the verify determination is NO and that the number of retrieving loops reaches the set maximum value (S32), the routine ends as an erase failure.

Figure 9A:
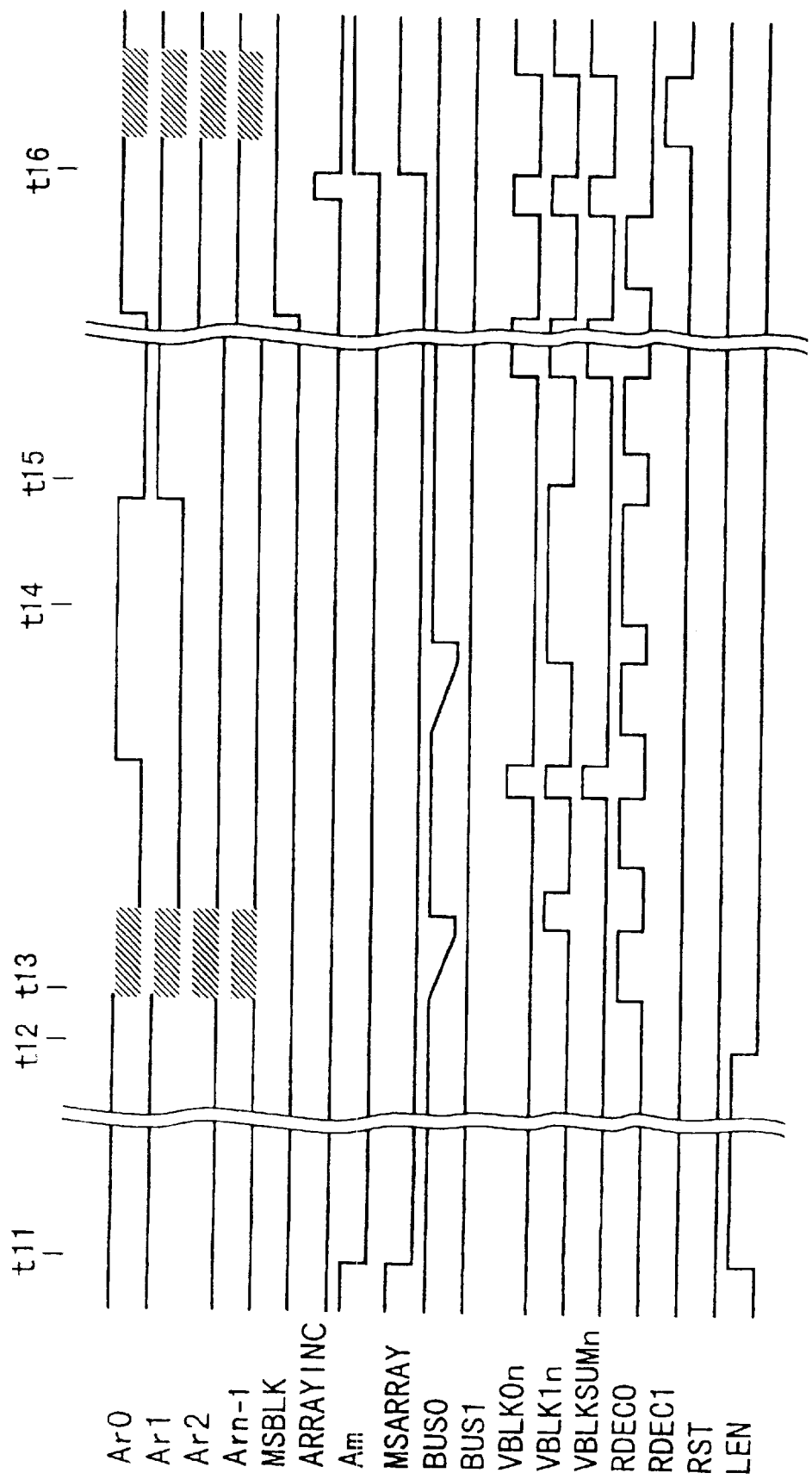
FIG. 9A is a timing chart (upper half) for data erase in the second preferred embodiment.
Figure 9B:
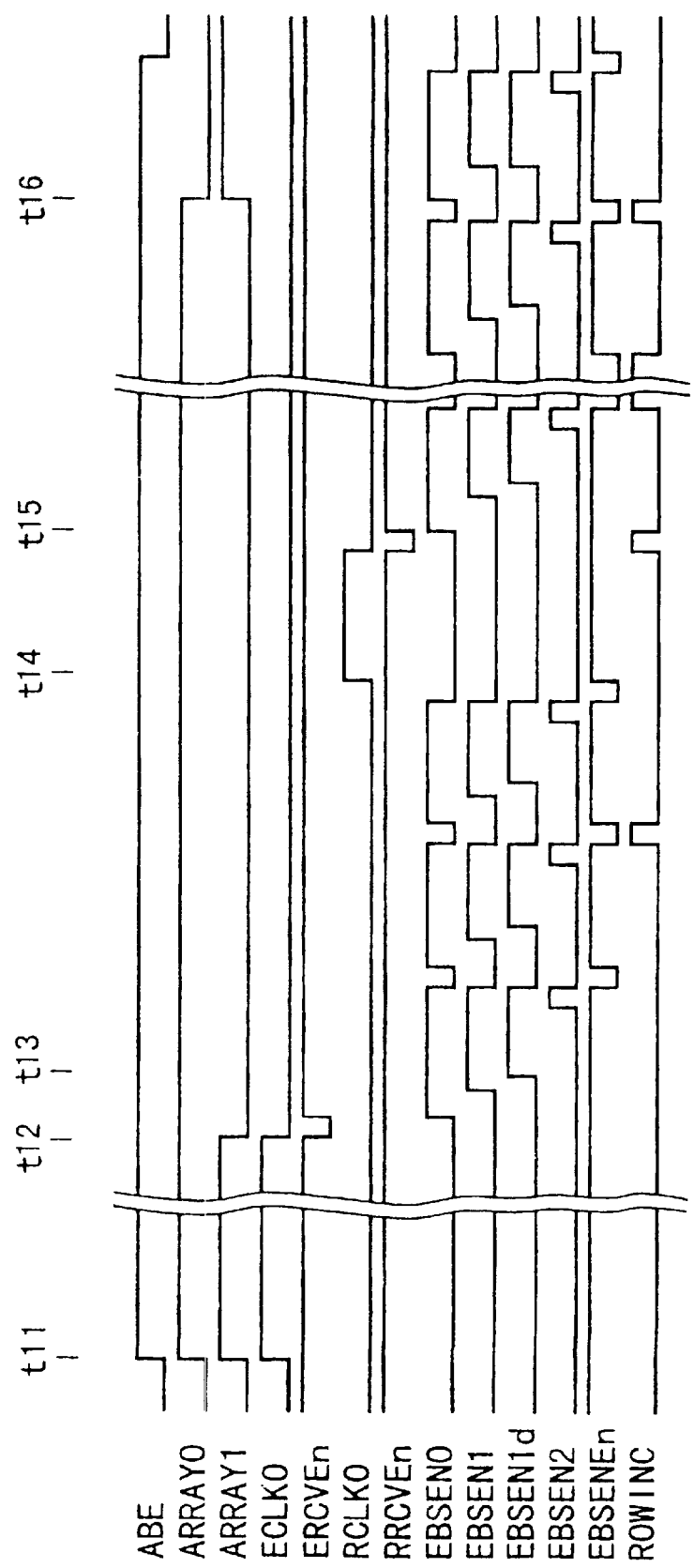
FIG. 9B is a timing chart (lower half) for data erase in the second preferred embodiment.

FIGS. 9A and 9B are timing charts for a data erasing operation in this preferred embodiment. In the example of the figure, the number of cell arrays is two, and ARRAY0 and ARRAY1 correspond to the array selecting flags LEFT and RIGHT in the preceding preferred embodiment, respectively. Common buses BUB0 and BUS1 correspond to the common buses BUSL and BUSR in the preceding preferred embodiment, respectively. In addition, the construction of a selected block detecting circuit 12 is basically the same as that in the preceding preferred embodiment. However, as a timing control signal entering a PMOS transistor QP21 for charging and controlling the common buses BUS0 and BUS1, a timing control signal EBSEN1d rising later than the EBSEN0 in the preceding preferred embodiment is used in place of the EBSEN0. Also with respect to other signals, "0" and "1" are used in place of "L" and "R" indicative of the left and right in the preceding preferred embodiment.

If the address of a block to be erased and an erase command are inputted, a command flag ABE becomes "H", and an erasing operation is started (t11). First, the address of a cell array is initialized, and then, two cell arrays are selected to be erased. This erasing operation is the same as that in the preceding preferred embodiment, and all of the selected blocks of the two cell arrays are batch-erased.

At time t12, the erasing operation ends. Thereafter, one of the cell arrays is unselected (ARRAY1="L"), and the other cell array is held to be in a selected state (ARRAY0="H"), so that it is retrieved whether an erased block exists in the cell array in the selected state. Then, when the timing control signal EBSEN1 becomes "H", the row decoders in all of the erased blocks in the selected cell array are batch-selected. In the circuit of FIG. 4, the predecode signal PREDECi is "H", and the row decode activating signal RDECL (shown as RDEC0 in FIG. 9A) is "H". Thus, the node N1 of the cell array ARRAY0 is connected to the common bus BUS0. This circuit operation is carried out simultaneously with respect to all of the erased blocks in the cell array ARRAY0, and the contents of the erase selecting flag in all of the blocks are batch-outputted to the common bus BUS0 in the form of wired OR.

Then, slightly delayed from the timing control signal EBSEN1, the timing control signal EBSEN1d becomes "H". Thus, the PMOS transistor QP21 for pre-charging the common bus in the erased block selecting circuit 12 shown in FIG. 5 is turned off, so that a block detection is carried out. That is, in the preceding preferred embodiment, the erase selecting flag is detected by the "H" of the timing signal EBSEN0, whereas in this preferred embodiment, the charging PMOS transistor QP21 is turned off after the erase selecting flags in the cell array are batch-selected. This is carried out to prevent the potential of the common bus from being decreased by the channel capacities of the transistors QN4 through QN6 of the discharge path 44 of FIG. 4 regardless of no selected block since the erase selecting flags in the cell array are batch-selected.

If the common bus BUS0 is discharged while the timing control signal EBSEN1d is "H", the presence of the erase selected block in the cell array ARRAY0 is detected. The example of FIG. 9 shows that the timing control signal EBSEN1d becomes "H" to decrease the potential of the common bus BUS0 so that the erased block exists in the cell array. If it is detected that the erased block exists in the cell array, the erase selected block is retrieved from the cell array. This is the same as the conventional case.

That is, after all of the address Ar0 through Arn-1 of the block are initialized to be "L", the block address is incremented to read the selecting flag of the separate block to be erased, and if the common bus BUS0 is discharged, the block is regarded as a selected block. In the example of FIG. 9, there is shown a case where it is detected that the block having address of Ar0="H" and Ar1 to Arn-1="L" at time t14 is selected. At this time, verify readout is carried out with respect to the erase selected block of this address.

In the verify operation, the clock signal RCLK0 for controlling the data reading operation in the chip is first "H" (time t14). Then, after the verify readout is completed, the end signal RRCVEn becomes "L" (time t15). After the verify, it is assumed that it is determined that the erase of the block having the address to be erased is sufficient. In this case, the operation for retrieving the erased block is carried out while further incrementing the block address. If the address of the block indicates the final address in the cell array, a signal ARRAYINC="H" for incrementing the cell array is outputted, so that the cell array ARRAY0 is unselected and the next cell array ARRAY1 is selected (time t16). Thereafter, with respect to the cell array ARRAY1, the same retrieval and verify operations are carried out. In the example of FIG. 9, the selected block is not detected in the retrieval for the presence of the selected block in the array ARRAY1. Therefore, all of the erase operations end in this time.

This preferred embodiment is particularly effective when a plurality of erase selecting blocks are not dispersed in a plurality of cell arrays and when the erase selecting blocks are concentrated in a certain cell array. This is because the retrieving is not uselessly repeated while updating the address with respect to cell arrays having no selected block. Thus, the time required to carry out the erase operation including the verify can be shortened. This effect increases as the number of cell arrays increases.

Third Preferred Embodiment

The third preferred embodiment substantially uses the same operation flow as that in the second preferred embodiment shown in FIG. 8B, except for a selected block retrieving step S23. In the operation for batch-erasing a plurality of blocks to be erased, a block address to be erased is inputted to an address register 5. In this preferred embodiment, as shown in FIG. 10A, an array selecting flag holding circuit 101 is provided for storing therein an array selecting flag indicative of the presence of an erased block for every cell array 1L or 1R when the block address to be erased is inputted.

Figure 10A:
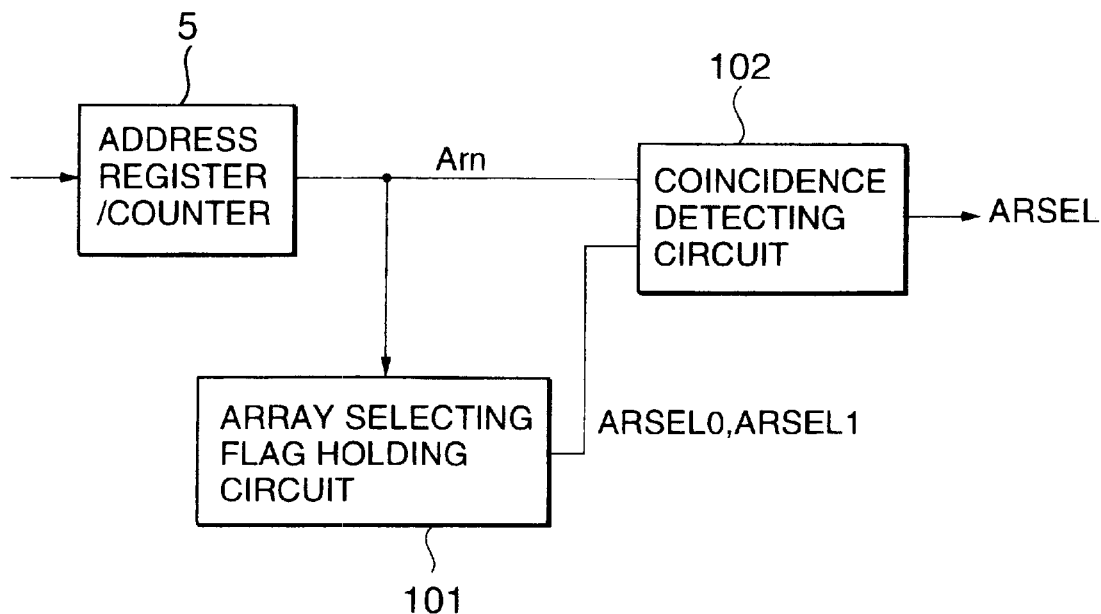
FIG. 10A is a block diagram of an array selecting flag holding circuit part in the third preferred embodiment.
Figure 10B:
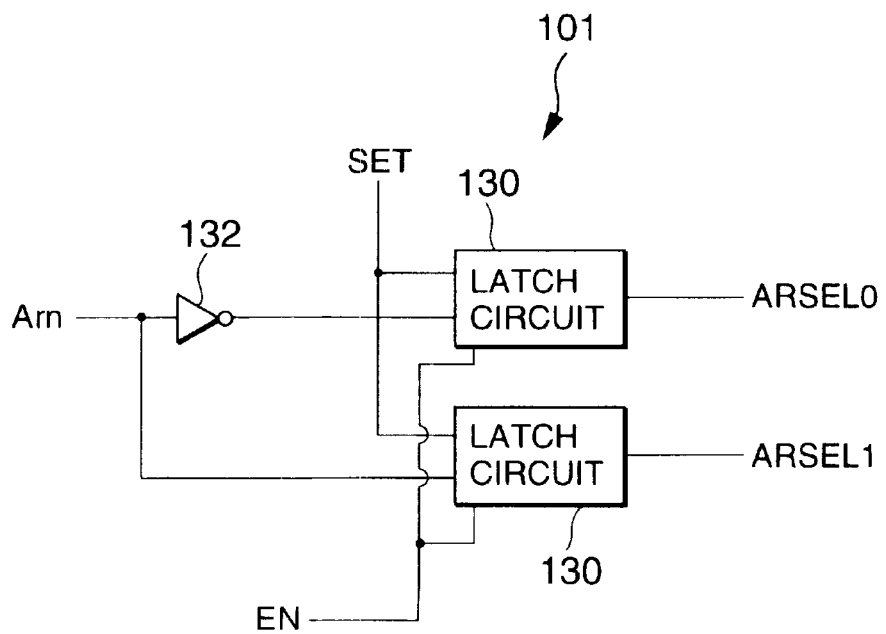
FIG. 10B is an example of an internal structure of the array selecting flag holding circuit shown in FIG. 10A.

FIG. 10B shows an example of the construction of the array selecting flag holding circuit 101 shown in FIG. 10A for use in a non-volatile semiconductor memory device. As shown in FIG. 10B, the array selecting flag holding circuit 101 comprises latch circuits 130 and a NOT gate 132. The number of latch circuits 130 is the same as that of cell arrays 1L and 1R. In the example of FIG. 10B, two latch circuits 130 are provided corresponding to two cell arrays 1L and 1R in FIG. 8A. The latch circuits 130 corresponding to the cell arrays 1L, 1R store the information that the cell arrays 1L, 1R have been selected, on the basis of the address Arn inputted from the address register/counter 5 at the beginning of the erase operation. As described above, the address Arn is the most significant address of the addresses Arn0 through Arn.

Figure 10C:
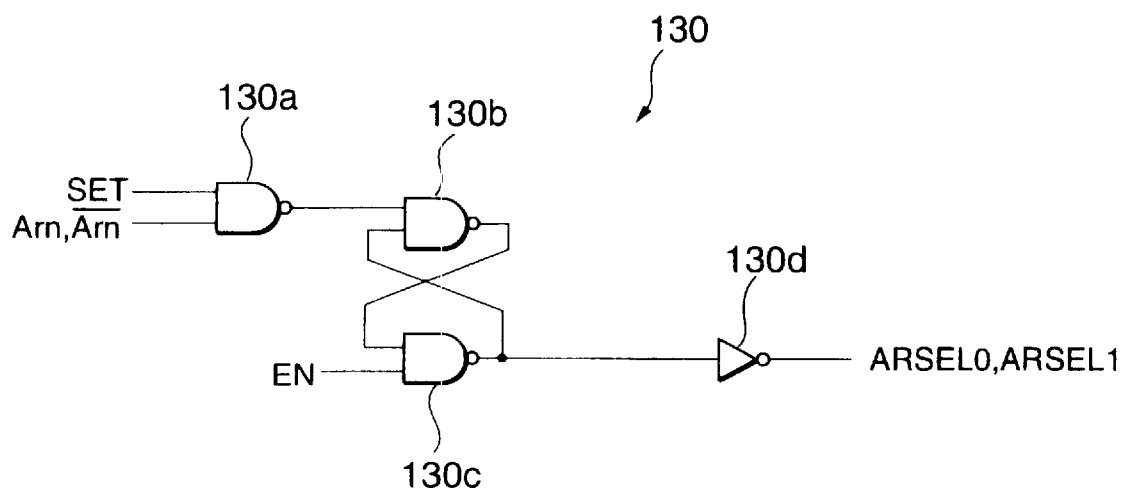
FIG. 10C is an example of an internal structure of the latch circuit shown in FIG. 10B.

FIG. 10C shows an example of the construction of the latch circuit 130. As shown in FIG. 10C, the latch circuit 130 comprises NAND gates 130a through 130c and a NOT gate 130d.

Figure 10D:
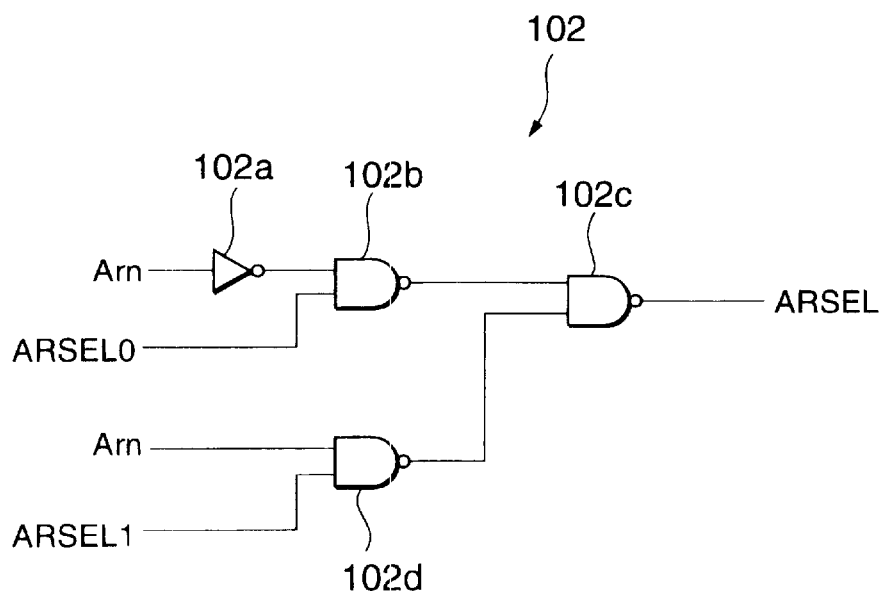
FIG. 10D is an example of an internal structure of the coincidence detecting circuit shown FIG. 10A.

FIG. 10D shows an example of the construction of the coincidence detecting circuit 102. As shown in FIG. 10D, the coincidence detecting circuit 102 comprises a NOT gate 102a and NAND gates 102b through 102d. The coincidence detecting circuit 102 compares the address Arn with the array selecting flags ARSEL0, ARSEL1 in retrieving the selected array.

As shown in FIGS. 10A through 10D, a set signal SET is HIGH when the address Arn is inputted. On the basis of the address Arn when the set signal SET is HIGH, the information that the cell arrays 1L, 1R have been selected is stored in the latch circuits 130. An enable signal EN defines a term during which the latch circuits 130 are in an enabling state. The array selecting flags ARSEL0, and ARSEL1 are outputted from the latch circuits 130 and inputted to the coincidence detecting circuit 102.

The coincidence detecting circuit 102 is inputted the address Arn as well as the array selecting flags ARSEL0 and ARSEL1. In retrieving the selected array, the coincidence detecting circuit 102 compares the address Arn with the array selecting flags ARSEL0 and ARSEL1, and outputs a detecting signal ARSEL when the address Arn corresponding to the cell array including the selected block is inputted. The detecting signal ARSEL is inputted to the erase control circuit 8 shown in FIG. 8A.

In this preferred embodiment, at step S23 of the flowchart shown in FIG. 8B, the erase selecting flags in the cell array 1L and 1R are not batch-read out, but the address register/counter 5 is sequentially counted up to the address Arn, and the coincident detecting circuit 102 compares the array selecting flags ARSEL0 and ARSEL1 of the array selecting flag holding circuit 101 with the address Arn. Then, whether or not a cell array includes a selected block is determined. The sequence of other processes is the same as that in the second embodiment.

Also in this preferred embodiment, the time required to carry out the erasing operation including the verify can be shortened similar to the second preferred embodiment.

Fourth Preferred Embodiment

Figure 11A:
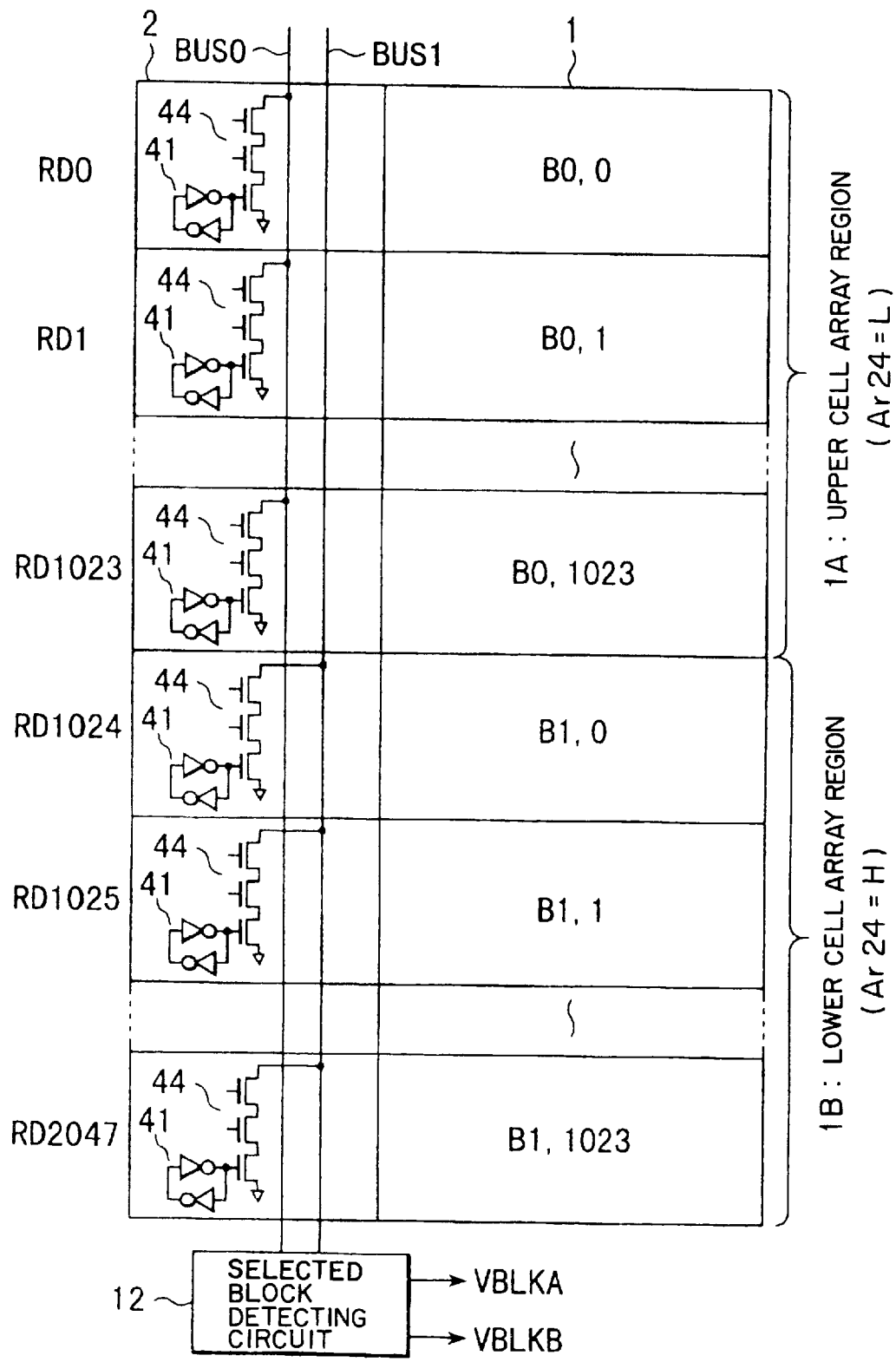
FIG. 11A is a schematic diagram showing a memory cell array and a row decoder part in the fourth preferred embodiment.
Figure 11B:
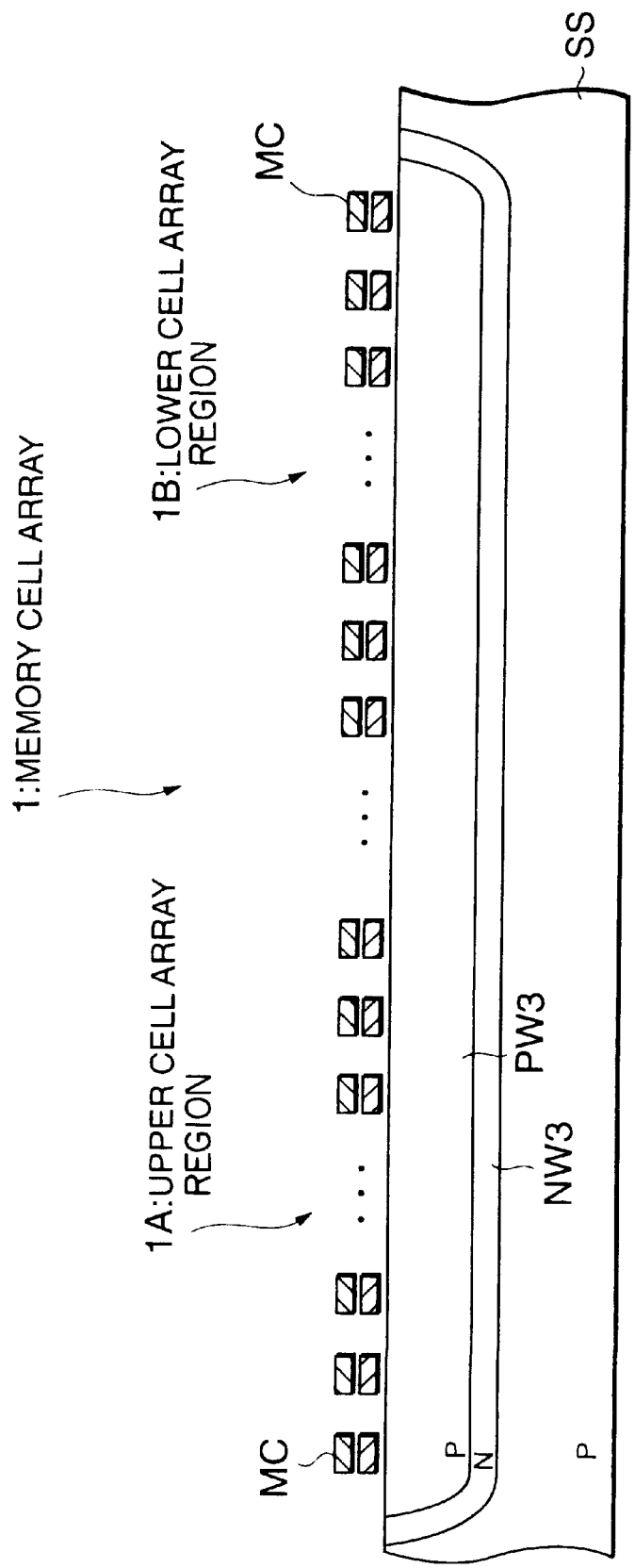
FIG. 11B is a sectional view schematically showing the fourth preferred embodiment of a non-volatile semiconductor memory device according to the present invention wherein two cell arrays are formed in the same well.

While the plurality of cell arrays constituting the memory cell array have been separated by wells in the preceding preferred embodiments, the present invention should not be limited thereto. In the fourth preferred embodiment, a plurality of cell array regions are formed in the same well. FIG. 11A shows the constructions of a memory cell array 1 and a row decoder 2. FIG. 11B schematically shows a cross section of the memory cell array 1 shown in FIG. 11A.

In this preferred embodiment, the memory cell array 1 is not physically separated by the well. As shown in FIG. 11B, an n-type well NW3 is formed on the surface of a p-type semiconductor substrate SS, and a p-type well PW3 is formed on the surface of the n-type well NW3. The memory cell array 1 is formed on this single p-type well PW3. However, the memory cell array 1 is divided into a plurality of cell array regions by upper and lower cell array regions rather than a block address. Specifically, an example of a 256 Mb device having addresses of Ar0 through Ar24 will be described. In this case, the memory cell array 1, can be divided into an upper cell array region 1A and a lower cell array region 1B as shown in FIG. 11A, by the "L" and "H" of the most significant address Ar24 assuming that addresses Ar14 through Ar24 are block addresses. Bit lines are continuously provided over all of the blocks in the memory cell array 1.

In the upper and lower cell array regions 1A and 1B thus divided by the address, common buses BUS0 and BUS1 utilized for simultaneously carrying out block retrievals in parallel with respect to the upper and lower cell array regions 1A and 1B after data erase are provided over all of the blocks of the respective cell array regions 1A and 1B. The common buses BUS0 and BUS1 correspond to the common buses BUSL and BUSR provided in the right and left cell array regions in the first preferred embodiment.

The row decoder 2 basically has the same construction as that in the first preferred embodiment, and is formed as shown in FIG. 4. Each of block decode parts RD0, RD1, . . . , RD2047 of the row decoder 2 is provided with a latch 41 serving as an erase flag holding circuit, and a discharge path 44 which is controlled by data held by the latch 41, an input block address and a timing signal for selectively discharging the common buses BUS0 and BUS1. The detailed constructions thereof are shown in FIG. 4. The discharge path 44 is connected to the common bus BUS0 in the upper cell array region 1A, and to the common bus BUS1 in the lower cell array region 1B.

In order to monitor the "H" and "L" of the common buses BUS0 and BUS1 during the retrieval of blocks, a selected block detecting circuit 12 is provided in each of the common buses BUS0 and BUS1, similar to the first preferred embodiment. The selected block detecting circuit 12 has the same construction as that in FIG. 5. The retrieved results are outputted as signals VBLKAn and VBLKBn (corresponding to the VBLKLn and VBLKRn in the first preferred embodiment) indicative of the presence of selected blocks for every cell array region.

Also in this preferred embodiment, operations other than the retrieval of the erased blocks are carried out as usual. For example, data erase can be carried out so as to erase multi-block for every block. After the retrieval of the blocks to be erased is started, the most significant address is multiple-selected, and Ar24 and its complementary signal Ar24n simultaneously become "H". Therefore, retrievals are simultaneously carried out in parallel for every two blocks of each of the cell array regions 1A and 1B selected by the address Ar0 through Ar23. The results of the retrieval of blocks are detected and outputted by the selected block detecting circuit 12. On the basis of the output signals VBLKA and VBLKB, erase verify is carried out.

Figure 12:
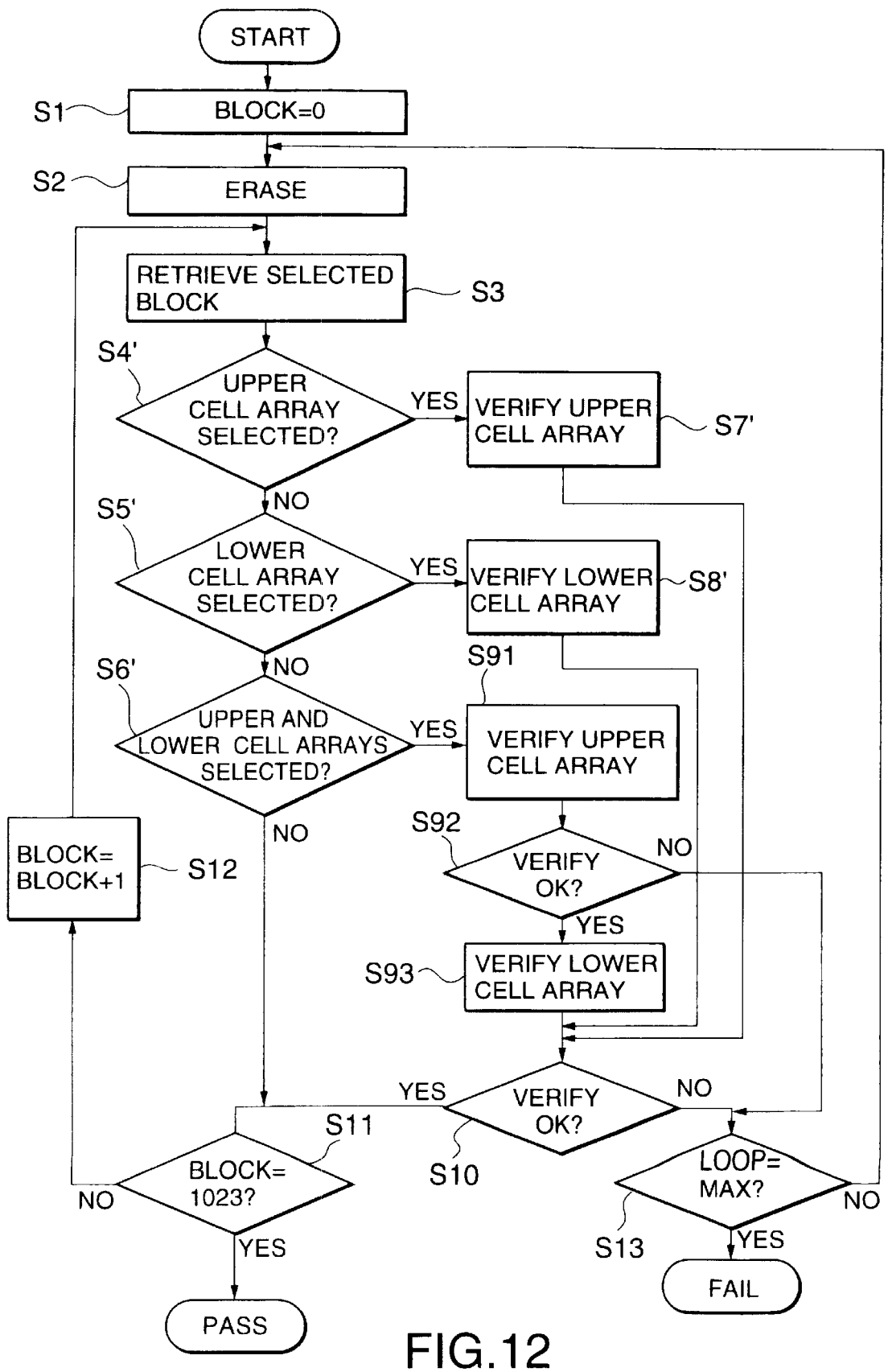
FIG. 12 is a flow chart showing a data erasing operation in the fourth preferred embodiment.

FIG. 12 is a flow chart specifically showing a data erasing operation in this preferred embodiment. Since the basic operation thereof is the same as that in the first preferred embodiment shown in FIG. 6, different points from FIG. 6 will be described below. In the selected block retrieval, the steps S4 through S6 of determining the selection of the right and left cell arrays in the first preferred embodiment correspond to steps S4' through S6' of determining the selection of upper and lower cell arrays in this preferred embodiment. If it is determined at step S6' that the upper and lower cell array regions 1A and 1B are simultaneously selected, verify operations can not be simultaneously carried out, so that the verify operations are sequentially carried out one by one, since the upper and lower cell arrays 1A and 1B commonly use bit lines and sense amplifiers.

First, the cell array region 1A having an address of Ar24="L" is verified (step S91), and the verify is determined (step S92). If NO is determined, the routine goes to step S13. If YES is determined, the lower cell array region 1B having an address of Ar24="H" is verified (step S93). Subsequent operations are the same as those in the first preferred embodiment.

As described above, according to this preferred embodiment, even if the memory cell array is formed in a single well, if the common bus for retrieving blocks is provided in a plurality of cell array regions divided by the address of the memory cell array, the retrievals of blocks can be simultaneously carried out in parallel with respect to the plurality of cell array regions, so that it is possible to accelerate the data erasing operation.

Figure 13:
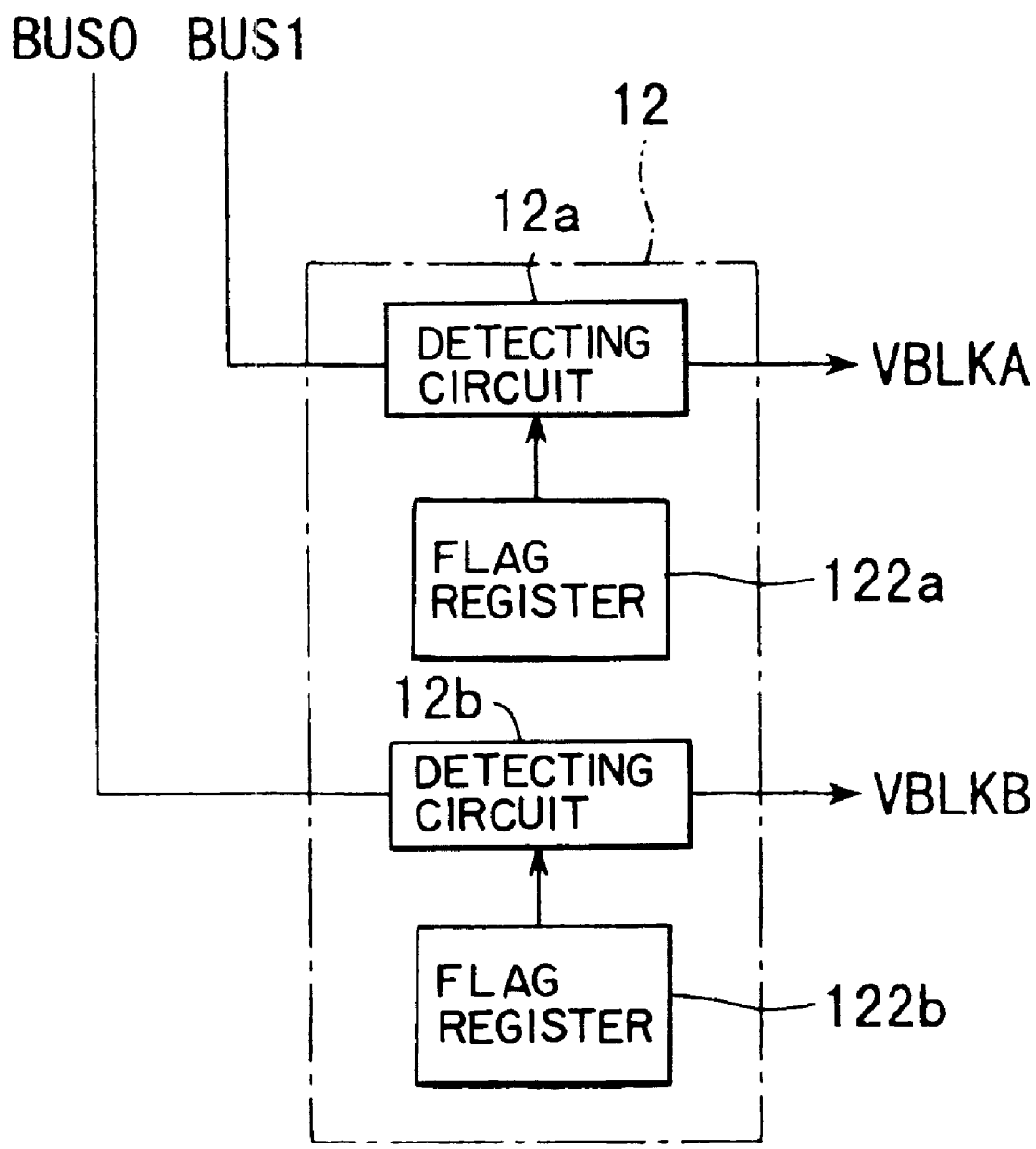
FIG. 13 is a block diagram of a preferred example of a selected block detecting circuit in the fourth preferred embodiment.

FIG. 13 shows an example where flag registers 122a and 122b for holding a flag indicative of the presence of a selected block in each of the cell array regions 1A and 1B are provided for detecting circuits 12a and 12b for every common bus of the selected block detecting circuit 12 shown in FIG. 11A. If the flag registers 122a and 122b are thus provided, it is possible to more effectively carry out the retrieval of blocks. That is, since continuous blocks are often erased in multi-block erase, erased blocks to be erased are often concentrated in any one of the cell array regions. In such a case, flag="1" is set for one of the flag registers 122a and 122b corresponding to the cell array regions including the blocks. Thus, the retrieval of blocks to be erased may be carried out with respect to only the cell array region wherein flag="1" is held. Thus, it is not required to carry out the useless retrieval of blocks, so that it is possible to carry out the erase procedure more rapidly and to reduce electric power consumption.

The present invention should not be limited to the above described preferred embodiments. For example, the present invention may not be applied only to NAND type EEPROMs, but the invention may also be applied to NOR type, DINOR type, AND type and other types of EEPROMs capable of batch-erasing a plurality of blocks to be erased.

As described above, according to the present invention, it is possible to provide an EEPROM capable of shortening the required time to carry out the retrieval of the selected block for the verify operation after data erase and shortening the required time to carry out the whole data erase.

What is claimed is:

1. A non-volatile semiconductor memory device comprising:

a memory cell array divided into a plurality of cell array regions, each of which includes a plurality of blocks, each of said blocks having electrically rewritable non-volatile memory cells arranged therein;

a data erasing part for selecting one or more of said blocks of said memory cell array to batch-erase data in the selected block(s) as an erased block(s) to be erased;

an erase information holding part, provided in each of said blocks of said memory cell array, for holding erase information indicating whether said block is one of said erased block(s);

a retrieving part for sequentially reading said erase information, which is held by said erase information holding part in each of said plurality of cell array regions, for every one of said blocks to detect said erased block(s), said retrieving part reading said erase information at the same timing for every one of said blocks in each of said cell array regions when said retrieving part reads said erase information from said erase information holding part; and an erase verify part for carrying out an erase verify for confirming an erased state of said memory cells with respect to said erased block(s), which are detected by said retrieving part, said erase verify part repeating a data erase operation with respect to said erased block(s) which are erased insufficiently, and said erase verify part carrying out said erase verify in parallel with respect to said erased block(s) which are detected on the basis of said erase information read at the same timing by said retrieving part.

2. A non-volatile semiconductor memory device as set forth in claim 1, wherein said retrieving part reads said erase information at the same timing for every one of said blocks from all of said cell array regions included in said memory cell array, when said retrieving part reads said erase information from said erase information holding part.

3. A non-volatile semiconductor memory device as set forth in claim 1, wherein said retrieving part comprises:
  common buses, each of which is provided in each of said cell array regions of said memory cell array, each of said common buses being connected to said erase information holding part; and
  a selected block detecting circuit, connected to said common buses, for monitoring said common buses to detect whether each of said blocks is a corresponding one of said erased block(s), which are selected during said data erase.

4. A non-volatile semiconductor memory device as set forth in claim 3, comprising a discharge path for discharging said common buses with respect to said erased block(s) which are selected during said data erase, when said retrieving part reads out said erase information from said erase information holding part.

5. A non-volatile semiconductor memory device as set forth in claim 1, wherein said plurality of cell array regions of said memory cell array are separated from each other by wells.

6. A non-volatile semiconductor memory device as set forth in claim 1, wherein said plurality of cell array regions of said memory cell array are formed in a single well and are separated from each other by assigning an address.

7. A non-volatile semiconductor memory device comprising:
  a memory cell array divided into a plurality of cell array regions, each of which includes a plurality of blocks, each of said blocks having electrically rewritable non-volatile memory cells arranged therein;
  a data erasing part for selecting one or more of said blocks of said memory cell array to batch-erase data in the selected block(s) as an erased block(s) to be erased;
  an erase information holding part, provided in each of said blocks of said memory cell array, for holding erase information indicating whether said block is one of said erased block(s);
  a detecting part for reading said erase information, which is held by said erase information holding part in each of said plurality of cell array regions, to detect whether one of said erased block(s) exists in each of said cell array regions; and
  an erase verify part for carrying out an erase verify for confirming an erased state of said memory cells with respect to said erased block(s) in said cell array regions in which the presence of said erased block(s) is detected by said detecting part, said erase verify being carried out with respect to said erased blocks by sequentially reading said erase information for every one of said blocks, and a data erase operation being repeated with respect to said erased block(s) which are erased insufficiently.

8. A non-volatile semiconductor memory device as set forth in claim 7, wherein said detecting part batch-reads said erase information, which is held by said erase information holding part in one of said cell array regions.

9. A non-volatile semiconductor memory device as set forth in claim 7, wherein said detecting part comprises:
  common buses, each of which is provided in each of said cell array regions of said memory cell array, each of said common buses being connected to said erase information holding part; and
  a selected block detecting circuit, connected to said common buses, for monitoring said common buses to detect whether each of said cell array regions includes at least one of said erased block(s).

10. A non-volatile semiconductor memory device as set forth in claim 9, further comprising a discharge path for discharging said common buses with respect to said erased block(s) which are selected during said data erase, when said erase information is read out from said erase information holding part.

11. A non-volatile semiconductor memory device as set forth in claim 9, wherein said plurality of cell array regions of said memory cell array are separated from each other by wells.

12. A non-volatile semiconductor memory device comprising:
  a memory cell array divided into a plurality of cell array regions, each of which includes a plurality of blocks, each of said blocks having electrically rewritable non-volatile memory cells arranged therein;
  a data erasing part for selecting one or more of said blocks of said memory cell array to batch-erase data in the selected block(s) as an erased block(s) to be erased;
  an erase information holding part for holding cell array erase information indicating whether each of said cell array regions includes one of said erased block(s), for every one of said cell array regions;
  a detecting part for reading said cell array erase information from said erase information holding part, to detect whether at least one of said erased block(s) exists in each of said cell array regions; and
  an erase verify part for carrying out an erase verify for confirming an erased state of said memory cells with respect to said erased block(s) in said cell array regions in which the presence of said erased block(s) is detected by said detecting part, said erase verify being carried out with respect to said erased blocks by sequentially reading said erase information for every one of said blocks, and a data erase operation being repeated with respect to said erased block(s) which are erased insufficiently.

13. A non-volatile semiconductor memory device as set forth in claim 12, wherein said erase information holding part produces and holds said cell array erase information on the basis of an address inputted to an address register when said data erasing part carries out said data erase.

14. A non-volatile semiconductor memory device as set forth in claim 12, wherein said plurality of cell array regions of said memory cell array are separated from each other by wells.

15. A data erase controlling method for a non-volatile semiconductor memory device having a memory cell array divided into a plurality of cell array regions, each of which includes a plurality of blocks, each of said blocks having electrically rewritable non-volatile memory cells arranged therein, said data erase controlling method comprising:

a data erasing step of selecting one or more of said blocks of said memory cell array to batch-erase data in the selected block(s) as an erased block(s);

an erase information holding step of holding erase information in an erase information holding part provided in each of said blocks of said memory cell array, said erase information indicating whether said block is one of said erased block(s);

a retrieving step of sequentially reading said erase information, which is held in said erase information holding part in each of said plurality of cell array regions, for every one of said blocks to detect said erased block(s), said retrieving step reading said erase information at the same timing for every one of said blocks in each of said cell array regions when reading said erase information from said erase information holding part; and an erase verify step of carrying out an erase verify for confirming an erased state of said memory cells with respect to said erased block(s), which are detected at said retrieving step, said erase verify step repeating a data erase operation with respect to said erased block(s) which are erased insufficiently, and said erase verify step carrying out said erase verify in parallel with respect to said erased block(s) which are detected on the basis of said erase information read at the same timing by said retrieving step.

16. A data erase controlling method for a non-volatile semiconductor memory device having a memory cell array divided into a plurality of cell array regions, each of which includes a plurality of blocks, each of said blocks having electrically rewritable non-volatile memory cells arranged therein, said data erase controlling method comprising:

a data erasing step of selecting one or more of said blocks of said memory cell array to batch-erase data in the selected block(s) as an erased block(s);

an erase information holding step of holding erase information in an erase information holding part provided in each of said blocks of said memory cell array, said erase information indicating whether said block is one of said erased block(s);

a detecting step of reading said erase information, which is held in said erase information holding part in each of said plurality of cell array regions, to detect whether one of said erased block(s) exists in each of said cell array regions; and an erase verify step of carrying out an erase verify for confirming an erased state of said memory cells with respect to said erased block(s) in said cell array regions in which the presence of said erased block(s) is detected at said detecting step, said erase verify being carried out with respect to said erased blocks by sequentially reading said erase information for every one of said blocks, and a data erase operation being repeated with respect to said erased block(s) which are erased insufficiently.

17. A data erase controlling method for a non-volatile semiconductor memory device having a memory cell array divided into a plurality of cell array regions, each of which includes a plurality of blocks, each of said blocks having electrically rewritable non-volatile memory cells arranged therein, said data erase controlling method comprising:

a data erasing step of selecting one or more of said blocks of said memory cell array to batch-erase data in the selected block(s) as an erased block(s) to be erased;

an erase information holding step of holding cell array erase information indicating whether each of said cell array regions includes one of said erased block(s), in an erase information holding part for every one of said cell array regions;

a detecting step of reading said cell array erase information from an erase information holding part, to detect whether at least one of said erased block(s) exists in each of said cell array regions; and an erase verify step of carrying out an erase verify for confirming an erased state of said memory cells with respect to said erased block(s) in said cell array regions in which the presence of said erased block(s) is detected at said detecting step, said erase verify step being carried out with respect to said erased blocks by sequentially reading said erase information for every one of said blocks, and a data erase operation being repeated with respect to said erased block(s) which are erased insufficiently.

* * * * *